(12) United States Patent
Maejima et al.

(10) Patent No.: US 8,531,028 B2
(45) Date of Patent: Sep. 10, 2013

(54) METHOD FOR MANUFACTURING ELECTRONIC COMPONENT, AND ELECTRONIC COMPONENT

(75) Inventors: Kenzou Maejima, Tokyo (JP); Satoru Katsurayama, Tokyo (JP); Toru Meura, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 120 days.

(21) Appl. No.: 13/319,531

(22) PCT Filed: Jul. 9, 2010

(86) PCT No.: PCT/JP2010/004469
§ 371 (c)(1),
(2), (4) Date: Nov. 9, 2011

(87) PCT Pub. No.: WO2011/007531
PCT Pub. Date: Jan. 20, 2011

(65) Prior Publication Data
US 2012/0061820 A1 Mar. 15, 2012

(30) Foreign Application Priority Data
Jul. 17, 2009 (JP) ................ P2009-168817

(51) Int. Cl.
*H01L 23/48* (2006.01)
*H01L 23/52* (2006.01)
*H01L 29/40* (2006.01)

(52) U.S. Cl.
USPC ............. 257/734; 257/793; 257/E23.141

(58) Field of Classification Search
USPC .................. 257/734, 793, E23.141
See application file for complete search history.

(56) References Cited

U.S. PATENT DOCUMENTS

2004/0171189 A1* 9/2004 Gaku et al. ............ 438/106
2007/0164429 A1* 7/2007 Lee ........................ 257/734

FOREIGN PATENT DOCUMENTS

| JP | 10-173005 A | 6/1998 |
| JP | 2002-343829 A | 11/2002 |
| JP | 2002-359264 A | 12/2002 |
| JP | 2003-100809 A | 4/2003 |

OTHER PUBLICATIONS (PCT/ISA/210) International Search Report dated Aug. 10, 2010 issued for PCT/JP2010/004469.

* cited by examiner

*Primary Examiner* — Chuong A Luu
*Assistant Examiner* — Nga Doan
(74) *Attorney, Agent, or Firm* — Birch, Stewart, Kolasch & Birch, LLP

(57) ABSTRACT

Provided is a method for manufacturing an electronic component by using a solder joining method for bonding a first electronic component having a metal electrode with a second electronic component having a solder electrode, the method comprising; (i) forming a resin layer containing a thermosetting resin on at least one of the solder joint surfaces of said first electronic component and said second electronic component; (ii) positioning said metal electrode of said first electronic component and said solder electrode of said second electronic component to face each other, heating said positioned electrodes and applying pressure, and thereby bringing said metal electrode and said solder electrode into contact; (iii) heating electronic components while applying pressure thereby fusion bonding said solder to said metal electrode; and (iv) heating said resin layer.

18 Claims, 8 Drawing Sheets

METHOD FOR MANUFACTURING
ELECTRONIC COMPONENT, AND
ELECTRONIC COMPONENT

TECHNICAL FIELD

The present invention relates to a method for manufacturing an electronic component, and an electronic component.

BACKGROUND ART

Along with the demand for functional enhancement and size and weight reduction of electronic apparatus of recent years, high density integration and high density packaging of electronic components such as semiconductor packages are underway. In order to obtain electrical connection in miniaturized, high pin count electronic components, solder joining is used. The solder joining is used in, for example, so-called conductive solder joints between semiconductor chips, conductive solder joints between a semiconductor chip and a circuit board such as in a flip-chip mounted package, and conductive solder joints between a circuit board and a circuit board. Furthermore, along with the demand for slimming, miniaturization, and narrow pitch connection of electronic components, reliability of the solder joint area is secured by filling a liquid encapsulating resin (underfill material) into the solder joint utilizing the capillary phenomenon, and thereby reinforcing the solder joint.

However, solder joints undergo narrowing of the pitch and narrowing of the gap, concomitantly with slimming and miniaturization of electronic components. Accordingly, although a liquid encapsulating resin (underfill material) is supplied after solder joining, there occurs a problem that the liquid encapsulating resin (underfill material) does not spread between the gaps, and it is difficult to fill a solder joint completely with the liquid encapsulating resin.

In order to avoid this problem, there has been proposed a technique of simultaneously filling a solder joint and between gaps by supplying in advance a liquid or film-like resin for encapsulating (underfill material) having a flux action, before Performing solder joining (see, Japanese Laid-Open Patent Publication No. 10-173005 and Japanese Laid-Open Patent Publication No. 2003-100809).

Patent Document 1: Japanese Laid-Open Patent Publication No. 10-173005
Patent Document 2: Japanese Laid-Open Patent Publication No. 2003-100809

DISCLOSURE OF THE INVENTION

However, even if the technique described above is used, it is difficult to completely fill a narrow-pitch or a narrow-gap solder joint, and a problem of the generation of voids and cavities may still occur.

The invention was made under such circumstances, and according to the invention, there are provided a method for manufacturing an electronic component by solder joining electronic components, filling the voids of a solder joint with a resin layer containing a thermosetting resin, and thereby reinforcing the solder joint, whereby generation of cavities (air gaps) can be suppressed and generation of voids (air bubbles) can also be suppressed; and an electronic component.

The object as described above is achieved by the invention as set forth in the following items (1) to (10).

(1) A method for manufacturing an electronic component by using a solder joining method for bonding a first electronic component having a metal electrode for connection purposes with a second electronic component having a solder electrode for connection purposes, the method including forming a resin layer containing a thermosetting resin on at least one of the solder joint surfaces of the first electronic component and the second electronic component; positioning, after the formation of the resin layer containing a thermosetting resin, the metal electrode for connection purposes of the first electronic component with the solder electrode for connection purposes of the second electronic component to face each other, heating the positioned electrodes at a temperature lower than the melting point of the solder of the solder electrode for connection purposes and applying pressure, and thereby bringing the metal electrode for connection purposes and the solder electrode for connection purposes into contact; heating the first electronic component and the second electronic component that have been brought into contact at a temperature higher than the melting point of the solder of the solder electrode for connection purposes while applying pressure using a pressurized fluid, and thereby fusion bonding the solder of the solder electrode for connection purposes to the metal electrode for connection purposes; and heating the resin layer containing a thermosetting resin at a temperature lower than the melting point of the solder of the solder electrode for connection purposes, and thereby curing the resin layer, with these processes being carried out in the order as described above.

(2) A method for manufacturing an electronic component by using a solder joining method for bonding a first electronic component having a metal electrode for connection purposes and a second electronic component having a solder electrode for connection purposes, the method including forming a resin layer containing a thermosetting resin on at least one of the solder joint surfaces of the first electronic component and the second electronic component; positioning, after the formation of the resin layer containing a thermosetting resin, the metal electrode for connection purposes of the first electronic component with the solder electrode for connection purposes of the second electronic component to face each other, heating the positioned electrodes at a temperature at which the coefficient of thermal expansion of the solder of the solder electrode for connection purposes is $30 \times 10^{-6}/°$ C. or less and applying pressure, and thereby bringing the metal electrode for connection purposes and the solder electrode for connection purposes into contact; heating the first electronic component and the second electronic component that have been brought into contact, at a temperature at which the coefficient of thermal expansion of the solder of the solder electrode for connection purposes becomes greater than $30 \times 10^{-6}/°$ C., while applying pressure using a pressurized fluid, and thereby fusion bonding the solder of the solder electrode for connection purposes to the metal electrode for connection purposes; and heating the resin layer containing a thermosetting resin at a temperature at which the coefficient of thermal expansion of the solder of the solder electrode for connection purposes is $30 \times 10^{-6}/°$ C. or less, and thereby curing the resin layer, with these processes being carried out in the order as described above.

(3) The method for manufacturing an electronic component as set forth in item (1) or (2), wherein the heating temperature in the positioning the metal electrode is 190° C. or lower, the heating temperature in the heating the first and second electronic components is 210° C. or higher, and the heating temperature in the heating the resin layer is 210° C. or lower.

(4) The method for manufacturing an electronic component as set forth in any one of items (1) to (3), wherein the metal electrode for connection purposes of the first electronic component is a solder electrode for connection purposes.

(5) The method for manufacturing an electronic component as set forth in any one of items (1) to (4), further comprising cooling the first electronic component and said second electronic component that have been brought into contact into a temperature lower than the melting point of said solder of said solder electrode for connection purposes, and then the pressure applied using said pressurized fluid is released, after the heating the first and second electronic components and prior the heating the resin layer.

(6) The method for manufacturing an electronic component as set forth in item (5), wherein the temperature lower than the melting temperature of the solder of the solder electrode for connection purposes is 200° C. or lower.

(7) The method for manufacturing an electronic component as set forth in any one of items (1) to (6), wherein the heating the resin layer is conducted while pressure is applied by a pressurized fluid.

(8) The method for manufacturing an electronic component as set forth in any one of items (1) to (7), wherein the thermosetting resin includes an epoxy resin.

(9) The method for manufacturing an electronic component as set forth in any one of items (1) to (8), wherein the resin layer containing a thermosetting resin includes a flux activating compound.

(10) An electronic component manufactured by using the method for manufacturing an electronic component as set forth in any one of items (1) to (9).

According to the invention, there are provided a method for manufacturing an electronic component by solder joining electronic components, filling the voids of a solder joint with an adhesive layer containing a thermosetting resin, and thereby reinforcing the solder joint, whereby the generation of cavities (air gaps) in the solder joint can be suppressed and the generation of voids (air bubbles) can also be suppressed, and an electronic component.

BEST MODE FOR CARRYING OUT THE INVENTION

Hereinafter, a method for manufacturing an electronic component and the electronic component of the invention will be described in detail.

[Electronic Component]

Figure 1:
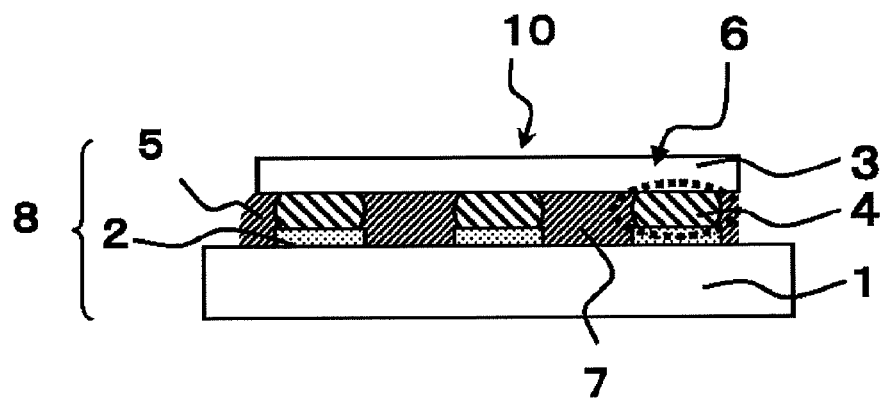
FIG. 1 is a cross-sectional view showing an example of an electronic component of the invention.

The electronic component of the invention will be described with reference to FIG. 1. FIG. 1 is a cross-sectional view showing an example of the electronic component of the invention. In the following explanation, the upper part of the drawing will be referred to as the "upside", and the lower part of the drawing as the "downside".

The electronic component 10 shown in FIG. 1 is a package having a flip-chip structure, and has a semiconductor chip 3, an interposer (substrate) 1 that supports the semiconductor chip 3, a metal electrode 2 formed in a predetermined pattern, a plurality of solder electrodes (solder bumps) 4 having electrical conductivity, and a resin layer 5 containing a thermosetting resin. As shown in FIG. 1, the electronic component 10 includes solder joints 6 at which the metal electrode 2 and the solder electrodes (solder bumps) 4 are fusion bonded, encapsulating areas 7 in which the resin layer 5 is cured, and a bonded body 8 in which the interposer (substrate) 1 and the semiconductor chip 3 are electrically connected.

The metal electrode 2 of the interposer 1 and the solder electrodes 4 of the semiconductor chip 3 are bonded by metallic bonding, and the interposer 1 and the semiconductor chip 3 are electrically connected.

Furthermore, the gaps between the interposer 1 and the semiconductor chip 3 are filled with the resin layer 5 containing a thermosetting resin.

The interposer 1 is an insulating substrate, and is composed of, for example, various resin materials such as a polyimide, an epoxy resin, a cyanate resin, and bismaleimidetriazine (BT resin). The planar shape of this interposer 1 is usually considered as a quadrangle shape such as a square or a rectangle. Furthermore, the interposer 1 may have a plurality of vias (through-holes) which penetrate through the interposer in the thickness direction, and are not depicted herein.

The metal electrode 2 is formed on the surface (one surface) of the interposer 1, using Cu. For example, the metal electrode 2 can be obtained by etching the copper foil of a copper-clad laminate plate in which copper foil is pasted onto a substrate, into a predetermined circuit pattern.

Furthermore, the metal electrode 2 is preferably an electrically conductive metallic material, and is formed using, for example, Cu, Al, Ni, a solder material, and the like. For the purpose of preventing oxidation of the metal electrode 2 or enhancing the joinability to the solder electrodes, the metal electrode may be constructed such that a metal such as Ag, Sn, or Au covers the metal electrode 2 by techniques such as plating and deposition.

The shape of the solder electrode 4 is not particularly limited, and may be a spherical shape, an elliptic shape, a cylindrical shape, a conical shape, or the like. Although there are no particular limitations, the solder electrode 4 is preferably an alloy of metals selected from Sn, Ag, Bi, Zn, Cu, Zn, In, Sb, Pb, and the like, and is particularly preferably an alloy of Sn—Pb, Sn—Ag, Sn—Ag—Cu, or Sn—Bi. More preferable examples include Sn—Ag, Sn—Ag—Cu, Sn—Bi, and Sn—Zn—Bi, which do not include Pb that has a potential of adversely affecting the environment or the human body.

The solder electrode 4 can be obtained by, for example, techniques such as plating on a metal electrode, screen printing, and solder paste coating.

The resin layer 5 contains a thermosetting resin. There are no particular limitations on the resin layer 5 so long as the resin layer contains a thermosetting resin for the purpose of enhancing the reliability after bonding and adhering the interposer 1 and the semiconductor chip 3. The resin layer 5 may be in a liquid form or in a film form at room temperature.

The resin layer 5 has a function of enhancing the joint strength between the interposer 1 and the semiconductor chip 3, or preventing penetration of foreign materials or moisture into the gaps. Accordingly, a highly reliable electronic component 10 can be obtained. Furthermore, it is preferable that the resin layer 5 contains a flux activating compound so as to increase wettability of the solder components that constitute the solder electrodes 4, to promote metallic bonding between the metal electrode 2 and the solder electrodes 4, and to securely achieve electrical conduction through the solder joints 6. Furthermore, when the resin layer 5 is in a film form at room temperature, the resin layer preferably contains a resin capable of film formation for the purpose of imparting film formability.

The thermosetting resin has a function of insulating between adjacent solder joints 6 in the bonded body 8 of the interposer 1 and the semiconductor chip 3, through the encapsulating areas 7 formed of the cured product of this thermosetting resin, and also has a function of fixing the interposer 1 and the semiconductor chip 3.

Such a thermosetting resin is not particularly limited, and examples thereof include an epoxy resin, an oxetane resin, a phenolic resin, a (meth)acrylate resin, an unsaturated polyester resin, a diallyl phthalate resin, and a maleimide resin. Among them, it is preferable to use an epoxy resin. Since an epoxy resin is excellent in curability and storability, as well as in heat resistance, moisture resistance and chemical resistance of the cured product, the epoxy resin is suitably used as a thermosetting resin.

For the epoxy resin, any one among an epoxy resin which is solid at room temperature and an epoxy resin which is liquid at room temperature may be used, or the epoxy resin may include both of these kinds. When the resin layer is constructed by using such an epoxy resin, the degree of freedom in the design of melting behavior of the thermosetting resin can be further increased.

There are no particular limitations on the epoxy resin which is solid at room temperature, but examples include epoxy resins, such as bisphenol type epoxy resins such as bisphenol A type epoxy resins, bisphenol F type epoxy resins, bisphenol AD type epoxy resins, and bisphenol E type epoxy resins; novolac type epoxy resins such as phenol novolac type epoxy resins, and cresol novolac type epoxy resins; aromatic glycidylamine type epoxy resins such as N,N-diglycidylaniline, N,N-diglycidyltoluidine, diaminodiphenylmethane type glycidylamine, and aminophenol type glycidylamine; hydroquinone type epoxy resins; biphenyl type epoxy resins such as biphenylaralkyl type epoxy resins; stilbene type epoxy resins; triphenolmethane type epoxy resins; triphenolpropane type epoxy resins; alkyl-modified triphenolmethane type epoxy resins; triazine nucleus-containing epoxy resins; dicyclopentadiene-modified phenol type epoxy resins; naphthol type epoxy resins; naphthalene type epoxy resins; and aralkyl type epoxy resins such as phenol aralkyl type epoxy resins having a phenylene and/or biphenylene skeleton, and naphthol aralkyl type epoxy resins having a phenylene and/or biphenylene skeleton. These resins can be used individually or in combination of two or more kinds.

Furthermore, there are no particular limitations on the epoxy resin which is a liquid at room temperature, but examples include bisphenol A type epoxy resins and bisphenol F type epoxy resins. These resins can be used individually or in combination of two or more kinds.

The epoxy equivalent of the epoxy resin which is a liquid at room temperature is preferably 150 to 300, more preferably 160 to 250, and even more preferably 170 to 220. Then, an increase in the contraction ratio in the cured product of the thermosetting resin can be prevented, and the occurrence of warpage in the bonded body 8 of the interposer 1 and the semiconductor chip 3 can be reliably prevented by the encapsulating areas 7.

Furthermore, the amount of the thermosetting resin in the resin layer 5 containing a thermosetting resin is preferably about 25% to 90% by weight, and more preferably about 35% to 80% by weight. Then, when the thermosetting resin is cured, satisfactory curability can be obtained, and at the same time, a satisfactory design of the melting behavior of the resin layer 5 containing a thermosetting resin is made possible.

Furthermore, it is preferable that the resin layer 5 containing a thermosetting resin contains a curing agent. Then, curability of the thermosetting resin can be further enhanced.

There are no particular limitations on the curing agent, and examples include phenols, amines, and thiols. Among these, when an epoxy resin is used as the thermosetting resin, it is preferable to use phenols. Then, satisfactory reactivity of the resin layer 5 containing a thermosetting resin with the epoxy resin can be obtained, and less change in the dimension at the time of curing of the epoxy resin contained in this resin layer 5 containing a thermosetting resin, and appropriate properties after curing (for example, heat resistance, and moisture resistance) can be obtained.

There are no particular limitations on the phenols, but a phenol having two or more functional groups that can react with the epoxy resin is preferable. Thus, an improvement of properties (for example, heat resistance, and moisture resistance) of the cured product of the epoxy resin in the resin layer 5 containing a thermosetting resin can be promoted.

Specific examples of such phenols include bisphenol A, tetramethyl bisphenol A, diallyl bisphenol A, biphenol, bisphenol F, diallyl bisphenol F, trisphenol, tetrakisphenol, phenol novolacs, and cresol novolacs. Among them, it is preferable to use phenol novolacs and cresol novolacs. Then, a suitable melt viscosity of the resin layer 5 containing a thermosetting resin can be obtained, and the reactivity with the epoxy resin can be enhanced. Furthermore, more excellent properties (for example, heat resistance, and moisture resistance) of the cured product of the epoxy resin in the resin layer 5 containing a thermosetting resin can be obtained.

When a phenol novolac is used as the curing agent, the amount of the curing agent in the resin layer 5 containing a thermosetting resin is preferably about 5% to 30% by weight, and more preferably about 10% to 25% by weight. Thus, the thermosetting resin in the resin layer 5 containing a thermosetting resin can be cured reliably, and also, residues of the thermosetting resin and unreacted curing agent are prevented from remaining in the resin layer 5 containing a thermosetting resin, so that the occurrence of migration caused by the presence of these residues can be suitably prevented.

When the thermosetting resin is an epoxy resin, the amount of the phenol novolac resin may be defined as an equivalent ratio with respect to the epoxy resin.

Specifically, the equivalent ratio of the phenol novolac to the epoxy resin is preferably about 0.5 to 1.2, more preferably about 0.6 to 1.1, and even more preferably about 0.7 to 0.98. When the equivalent ratio is set in the range described above, the same effects as described above can be obtained.

Specific examples of the amines include ethylenediamine, 1,3-diaminopropane, 1,4-diaminobutane, diethylenetriamine, triethylenetetramine, tetraethylenepentamine, pentaethylenehexamine, dipropylenediamine, diethylaminopropylamine, tri(methylamino)hexane, dimethylaminopropylamine, diethylaminopropylamine, methyliminobispropylamine, hexamethylenediamine, diaminodiphenylmethane, diaminodiphenylsulfone, isophoronediamine, menthenediamine, isophoronediamine, bis(4-amino-3-methyldicyclohexyl)methane, diaminodicyclohexylmethane, N-aminoethylpiperazine, 3,9-bis(3-aminopropyl)-2,4,8,10-tetraoxaspiro[5,5]undecane, 2,5-dimethylhexamethylenediamine, trimethylhexamethylenediamine, iminobispropylamine, bis(hexamethylene)triamine, m-xylenediamine, metaphenylenediamine, diaminodiethylphenylmethane, and polyether diamine.

Furthermore, in addition to the curing agent described above, for example, an imidazole compound having a melting point of 150° C. or higher can be used. Thus, curability of the thermosetting resin is enhanced, and the process can be shortened.

The imidazole compound having a melting point of 150° C. or higher includes 2-methylimidazole, 2-ethyl-4-methylimidazole, 2-undecylimidazole, 2-heptadecylimidazole, 2-phenyl-4,5-dihydroxymethylimidazole, 2-phenylimidazole, 2-ethylimidazole, 2-ethyl-4-methylimidazole, and 2-phenyl-4-methylimidazole. There are no particular limitations on the upper limit of the melting point of the imidazole compound, and the upper limit of the melting point may be appropriately selected in accordance with the adhesion temperature of the resin layer 5 containing a thermosetting resin.

When such an imidazole compound is used as a curing agent, the amount of the curing agent in the resin layer 5 containing a thermosetting resin is preferably about 0.005% to 10% by weight, and more preferably about 0.01% to 5% by weight. Thus, the function of the thermosetting resin as a curing catalyst can be more effectively exhibited, curability of the thermosetting resin in the resin layer 5 containing a thermosetting resin can be enhanced, and a decrease in the storability of the resin layer 5 containing a thermosetting resin can be suppressed.

In addition, the curing agent such as that described above may be used alone, or two or more kinds may be used in combination.

The resin layer 5 containing a thermosetting resin may further contain an inorganic filler material. Then, the linear expansion coefficient of the resin layer 5 can be decreased, and accordingly, reliability can be increased. Furthermore, the resin layer 5 containing a thermosetting resin may have various additives appropriately incorporated therein, in addition to the components described above, for an enhancement of various properties such as compatibility of the resin, stability, and workability.

The flux activating compound according to the invention has a function of reducing the surface of the solder electrode 4 when the interposer 1 and the semiconductor chip 3 are heated under the pressure of a pressurized fluid during the third step that will be described later. Thus, wettability of the solder components constituting the solder electrode 4 can be increased, and metallic bonding between the metal electrode 2 and the solder electrode 4 can be promoted. As a result, electrical conduction through the solder joints 6 can be obtained with certainty.

Furthermore, it is preferable that such a flux activating compound has a functional group that binds to the thermosetting resin. Therefore, the flux activating compound functions also as a curing agent when the thermosetting resin is cured by heating, and thus the flux activating compound is added to the thermosetting resin. As a result, in the resin layer 5 containing a thermosetting resin included in the bonded body 8 of the interposer 1 and the semiconductor chip 3 thus formed, the occurrence of ion migration which is attributed to the flux activating compound residue can be suitably suppressed. Furthermore, when the flux activating compound is added to the thermosetting resin, an effect of raising the elastic modulus and/or the glass transition temperature of the cured product of the thermosetting resin, can also be obtained.

In consideration of the facts discussed above, it is preferable to use a compound having a carboxyl group and/or a phenolic hydroxyl group as the compound having flux activity.

The flux activating compound having a carboxyl group and/or a phenolic hydroxyl group means a compound which has at least one carboxyl group and/or a phenolic hydroxyl group in the molecule, and the flux activating compound may be a liquid or may be a solid.

Among these, the flux activating compound having a carboxyl group include an aliphatic acid anhydride, an alicyclic acid anhydride, an aromatic acid anhydride, an aliphatic carboxylic acid, and an aromatic carboxylic acid.

The aliphatic acid anhydride include succinic anhydride, polyadipic anhydride, polyazelaic anhydride, and polysebaccic anhydride.

The alicyclic acid anhydride include methyltetrahydrophthalic anhydride, methylhexahydrophthalic anhydride, methylhymic anhydride, hexahydrophthalic anhydride, tetrahydrophthalic anhydride, trialkyltetrahydrophthalic anhydride, and methylcyclohexenedicarboxylic acid anhydride.

The aromatic acid anhydride include phthalic anhydride, trimellitic anhydride, pyromellitic anhydride, benzophenonetetracarboxylic acid anhydride, ethylene glycol bistrimellitate, and glycerol tristrimellitate.

The aliphatic carboxylic acid include a compound represented by the following general formula (1), formic acid, acetic acid, propionic acid, butyric acid, valeric acid, pivalic acid, caproic acid, caprylic acid, lauric acid, myristic acid, palmitic acid, stearic acid, acrylic acid, methacrylic acid, crotonic acid, oleic acid, fumaric acid, maleic acid, oxalic acid, malonic acid, and succinic acid.

$$HOOC-(CH_2)_n-COOH \qquad (1)$$

(wherein in the formula, n represents an integer from 0 to 20)

The aromatic carboxylic acid include benzoic acid, phthalic acid, isophthalic acid, terephthalic acid, hemimellitic acid, trimellitic acid, trimesic acid, mellophanic acid, pretonic acid, pyromellitic acid, mellitic acid, toluylic acid, xylylic acid, hemellitic acid, mesitylenic acid, prehnitic acid, toluic acid, cinnamic acid, salicylic acid, 2,3-dihydroxybenzoic acid, 2,4-dihydroxybenzoic acid, gentisic acid (2,5-dihydroxybenzoic acid), 2,6-dihydroxybenzoic acid, 3,5-dihydroxybenzoic acid, gallic acid (3,4,5-trihydroxybenzoic acid), naphthoic acid derivatives such as 1,4-dihydroxy-2-naphthoic acid and 3,5-dihydroxy-2-naphthoic acid; phenolphthalin; and phenolic acid.

Among these, while a balance between the degree of activity carried by the flux activating compound, amount of outgas generation during the curing of the thermosetting resin, and the elastic modulus or glass transition temperature of the encapsulating areas 7 present in the bonded body 8 of the interposer 1 and the semiconductor chip 3 are taken into consideration, it is preferable to use a compound represented by the above general formula (1), and it is more preferable that n in the formula is about 3 to 10. Thus, in the bonded body 8 of the interposer 1 and the semiconductor chip 3, an increase in the elastic modulus of the cured product of the thermosetting resin can be suppressed, and also, adhesiveness between this cured product and the interposer 1 or the semiconductor chip 3 can be increased.

Examples of the compound represented by the general formula (1) wherein n is 3 to 10, include glutaric acid with n=3 [HOOC—(CH$_2$)$_3$—COOH], adipic acid with n=4 [HOOC—(CH$_2$)$_4$—COOH], pimelic acid with n=5 [HOOC—(CH$_2$)$_5$—COOH], sebacic acid with n=8 [HOOC—(CH$_2$)$_8$—COOH], and [HOOC—(CH$_2$)$_{10}$—COOH] with n=10.

Furthermore, the flux activating compound having a phenolic hydroxyl group may be phenols, and specific examples include monomers containing a phenolic hydroxyl group, such as phenol, o-cresol, 2,6-xylenol, p-cresol, m-cresol, o-ethylphenol, 2,4-xylenol, 2,5-xylenol, m-ethylphenol, 2,3-xylenol, mesitol, 3,5-xylenol, p-tertiary butylphenol, catechol, p-tertiary amylphenol, resorcinol, p-octylphenol, p-phenylphenol, bisphenol A, bisphenol F, bisphenol AF, biphenol, diallyl bisphenol F, diallyl bisphenol A, trisphenol, and tetrakisphenol; and phenol novolac resins, o-cresol novolac resins, bisphenol F novolac resins, and bisphenol A novolac resins.

The flux activating compound having a carboxyl group and/or a phenolic hydroxyl group such as described above is reacted with the thermosetting resin such as an epoxy resin, and is in three-dimensionally introduced into the obtained reaction product.

Therefore, from the viewpoint of enhancing the formation of a three-dimensional network of the epoxy resin after curing, a compound having, in one molecule, at least two phenolic hydroxyl groups that can be added to the epoxy resin and at least one carboxyl group which is directly bonded to an aromatic moiety exhibiting a flux action (reducing action) on solder, is preferable.

Examples of such a flux activating compound include benzoic acid derivatives such as 2,3-dihydroxybenzoic acid, 2,4-dihydroxybenzoic acid, gentisic acid (2,5-dihydroxybenzoic acid), 2,6-dihydroxybenzoic acid, 3,4-dihydroxybenzoic acid, and gallic acid (3,4,5-trihydroxybenzoic acid); naphthoic acid derivatives such as 1,4-dihydroxy-2-naphthoic acid, 3,5-dihydroxy-2-naphthoic acid, and 3,7-dihydroxy-2-naphthoic acid; phenolphthalin; and diphenolic acid. However, gentisic acid (2,5-dihydroxybenzoic acid), 2,6-dihydroxybenzoic acid, and phenolphthalin, which have a good balance between the properties after curing of the thermosetting resin and the flux action, are preferable. These flux activating compounds can be used individually or in combination of two or more kinds.

Furthermore, the amount of the flux activating compound in the resin layer 5 containing a thermosetting resin is preferably about 1% to 30% by weight, and more preferably about 3% to 25% by weight. Then, the flux activity in the resin layer 5 containing a thermosetting resin can be enhanced, and also, the thermosetting resin and unreacted flux activating compound are prevented from remaining in the encapsulating areas 7 present in the bonded body 8 of the interposer 1 and the semiconductor chip 3, so that the occurrence of migration caused by the presence of these residues can be suitably prevented.

Furthermore, it is preferable that such a flux activating compound is uniformly dispersed in the resin layer 5 containing a thermosetting resin. As discussed in the above, when the flux activating compound is uniformly dispersed, the flux activating compound efficiently moves to the interface between the metal electrode 2 and the solder electrode 4, and these electrodes can be brought into direct contact. As a result, the connection reliability of the solder joints 6 can be increased.

When the resin layer 5 containing a thermosetting resin is in a film form, it is preferable that the resin layer contains a film-forming resin. The film-forming resin include a (meth)acrylic resin, a phenoxy resin, a polyester resin, a polyurethane resin, a polyimide resin, a siloxane-modified polyimide resin, polybutadiene, polypropylene, a styrene-butadiene-styrene copolymer, a styrene-ethylene-butylene-styrene copolymer, a polyacetal resin, a polyvinyl butyral resin, a polyvinyl acetal resin, a butyl rubber, a chloroprene rubber, a polyamide resin, an acrylonitrile-butadiene copolymer, an acrylonitrile-butadiene-acrylic acid copolymer, an acrylonitrile-butadiene-styrene copolymer, a polyvinyl acetate, and nylon. Particularly preferred are a (meth)acrylic resin, a phenoxy resin, and a polyimide resin, which are excellent in film formability and adhesiveness to the interposer 1 or the semiconductor chip 3. These exemplified film-forming resins can be used individually, or in combination of two or more kinds.

In addition, the term (meth)acrylic resin as used in the present embodiment means a polymer of (meth)acrylic acid or a derivative thereof, or a copolymer of (meth)acrylic acid or a derivative thereof with another monomer. Here, the expression (meth)acrylic acid means acrylic acid or methacrylic acid.

Specific examples of the (meth)acrylic resin include polyacrylic acid esters such as polyacrylic acid, polymethacrylic acid, polymethyl acrylate, polyethyl acrylate, polybutyl acrylate, and poly(2-ethylhexyl acrylate); polymethacrylic acid esters such as polymethyl methacrylate, polyethyl methacrylate, and polybutyl methacrylate; polyacrylonitrile, polymethacrylonitrile, polyacrylamide, a butyl acrylate-ethyl acrylate-acrylonitrile copolymer, an acrylonitrile-butadiene copolymer, an acrylonitrile-butadiene-acrylic acid copolymer, an acrylonitrile-butadiene-styrene copolymer, an acrylonitrile-styrene copolymer, a methyl methacrylate-styrene copolymer, a methyl methacrylate-acrylonitrile copolymer, a methyl methacrylate-α-methylstyrene copolymer, a butyl acrylate-ethyl acrylate-acrylonitrile-2-hydroxyethyl methacrylate-methacrylic acid copolymer, a butyl acrylate-ethyl acrylate-acrylonitrile-2-hydroxyethyl methacrylate-acrylic acid copolymer, a butyl acrylate-acrylonitrile-2-hydroxyethyl methacrylate copolymer, a butyl acrylate-acrylonitrile-acrylic acid copolymer, a butyl acrylate-ethyl acrylate-acrylonitrile copolymer, and an ethyl acrylate-acrylonitrile-N,N-dimethylacrylamide copolymer. Among these, a butyl acrylate-ethyl acrylate-acrylonitrile copolymer-2-hydroxyethyl methacrylate-methacrylic acid, and ethyl acrylate-acrylonitrile-N,N-dimethylacrylamide are preferred.

When a (meth)acrylic resin produced by copolymerizing monomers having a functional group such as a nitrile group, an epoxy group, a hydroxyl group or a carboxyl group is used, the adhesiveness of the resin layer 5 containing a thermosetting resin to the interposer 1 and the semiconductor chip 3, and the compatibility of the resin layer with the thermosetting resin can be increased.

In regard to such a (meth)acrylic resin, the amount of use of the monomers having a functional group is not particularly limited, but the amount of use is preferably about 0.1 mol % to 50 mol %, more preferably about 0.5 mol % to 45 mol %, and even more preferably about 1 mol % to 40 mol %, based on the total weight of the (meth)acrylic resin. When the amount of the monomers used is set to this range, the adhesiveness of the resin layer 5 containing a thermosetting resin to the interposer 1 or the semiconductor chip 3 can be made excellent, and the adhesive power of the resin layer 5 containing a thermosetting resin can be suitably prevented from becoming excessively strong, so that an enhancement of workability can be promoted.

There are no particular limitations on the weight average molecular weight of the (meth)acrylic resin, but the weight average molecular weight is preferably 100,000 or greater, more preferably about 150,000 to 1,000,000, and even more preferably about 250,000 to 900,000. When the weight average molecular weight is set to the above-mentioned range, the film formability of the resin layer 5 containing a thermosetting resin can be improved.

Furthermore, when a phenoxy resin is used as the film-forming resin, it is preferable to use a phenoxy resin having a number average molecular weight of about 5,000 to 15,000. When a phenoxy resin having such a number average molecular weight is used, fluidity of the resin layer 5 containing a thermosetting resin can be suppressed, and the thickness of the resin layer 5 containing a thermosetting resin can be made uniform.

There are no particular limitations on the skeleton of the phenoxy resin, but examples include a bisphenol A type, a bisphenol F type, and a biphenyl skeleton type. Among these, a phenoxy resin having a saturated water absorption of 1% or less is preferable. Then, during the formation of the bonded body 8 of the interposer 1 and the semiconductor chip 3, or when the bonded body is exposed to high temperature conditions, the occurrence of foaming or detachment caused by the resin layer 5 containing a thermosetting resin can be suppressed.

Here, with regard to the saturated water absorption, a phenoxy resin is processed into a film having a thickness of 25 μm, and the weight of the film at the time point when the film has been dried for one hour in an atmosphere at 100° C. (absolute dryness) is measured. After the film is left to stay in a constant temperature high humidity tank in an atmosphere at 40° C. and 90% RH, changes in the weight are measured at an interval of 24 hours. The weight at the time point when the weight change is saturated can be used to calculate the saturated water absorption according to the following formula (2).

Saturated water absorption (%)={(Weight at time point of saturation)−(Weight at time point of absolute dryness)}/(Weight at time point of absolute dryness)×100   (2)

Furthermore, when a polyimide resin is used as the film-forming resin, the polyimide resin may be a resin having an imide bond in the repeating units.

Examples of such a polyimide resin include a polymer obtainable by reacting a diamine with an acid dianhydride, and heating the polyamide acid thus obtained to bring about dehydration and ring-closing. Examples of the diamine include aromatic diamines such as 3,3'-dimethyl-4,4'-diaminodiphenyl, 4,6-dimethyl-m-phenylenediamine, and 2,5-dimethyl-p-phenylenediamine; and siloxanediamines such as 1,3-bis(3-aminopropyl)-1,1,3,3-tetramethyldisiloxane.
Among these, one kind can be used alone, or two or more kinds can be used in combination.

Examples of the acid dianhydride include 3,3,4,4'-biphenyltetracarboxylic acid, pyromellitic dianhydride, and 4,4'-oxydiphthalic dianhydride.

With regard to such a polyimide resin, a resin that is soluble in the solvents that will be described below can be used, or a resin that is insoluble in the solvents can also be used; however, a polyimide resin that is soluble in the solvents is preferable. Particularly, a siloxane-modified polyimide resin is suitably used because the resin can be dissolved in various solvents.

When the resin layer 5 containing a thermosetting resin as such is a liquid at room temperature, the resin layer can be obtained by, for example, weighing a thermosetting resin, and optionally a flux activating compound, a film-forming resin, or other components; dispersing and kneading the mixture with a three-roll mill; and subjecting the kneading product to a defoaming treatment in a vacuum.

When the resin layer 5 containing a thermosetting resin as such is in a film form at room temperature, the resin layer can be obtained by, for example, dissolving a thermosetting resin, and optionally a flux activating compound, a film-forming resin or other components in a solvent to prepare a material (liquid material) for bonding sheet formation; subsequently applying this material for bonding sheet formation on a base material such as a polyester sheet, which has been subjected to a peeling treatment; removing the solvent at a predetermined temperature; and drying the product.

Examples of the solvent that is used herein include ketones such as acetone, methyl ethyl ketone, methyl isobutyl ketone, DIRK (diisobutyl ketone), cyclohexanone, and DAA (diacetone alcohol); aromatic hydrocarbons such as benzene, xylene, and toluene; alcohols such as methyl alcohol, ethyl alcohol, isopropyl alcohol, and n-butyl alcohol; cellosolves such as methylcellosolve, ethylcellosolve, butylcellosolve, methylcellosolve acetate, ethylcellosolve acetate, and BCSA (butylcellosolve acetate); NMP (N-methyl-2-pyrrolidone), THF (tetrahydrofuran), DMF (dimethylformamide), DBE (dibasic acid ester), EEP (ethyl 3-ethoxypropionate), and DMC (dimethyl carbonate).

The thickness (average) of the resin layer 5 containing a thermosetting resin is not particularly limited, but is preferably about 5 to 300 μm, and more preferably about 10 to 200 μm.

Figure 2:
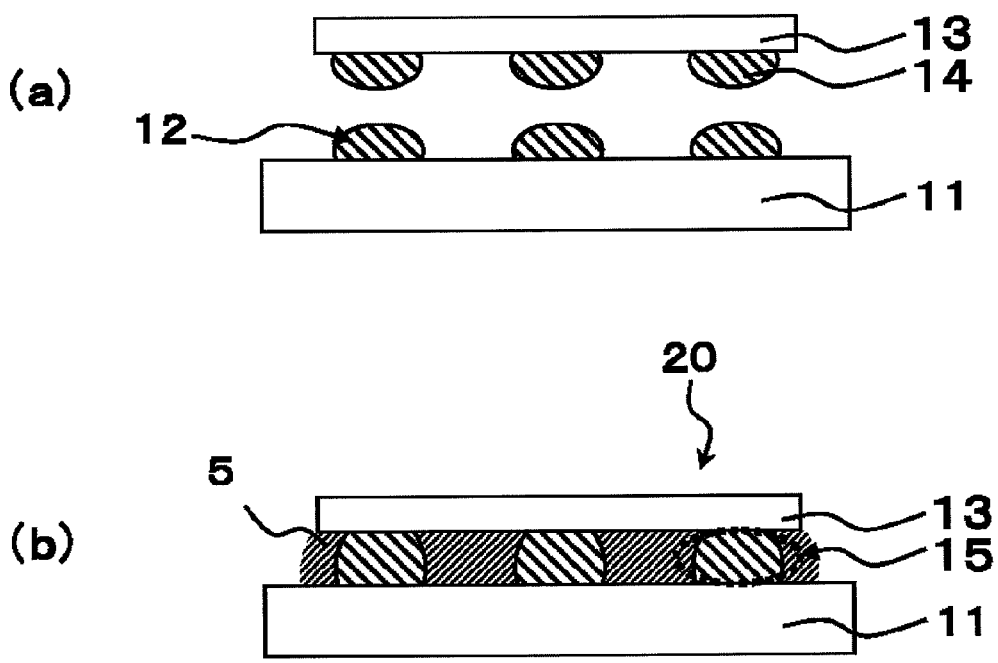
FIG. 2 is a process cross-sectional view showing a modification example of an electronic component of the invention.

The electronic component of the invention is not limited to the electronic component 10, and may be in various modified forms. For example, the invention was described above by taking an example of forming the metal electrode 2 using Cu, but as shown in FIG. 2, the metal electrode may be a solder electrode 12 which uses a solder material. The electronic component 20 has a configuration completely identical with that of the electronic component 10 shown in FIG. 1, except that the metal electrode 2 on the interposer 1 is changed to a solder electrode 12, and the electronic component 20 is formed from a solder electrode 12 of the interposer 11 and a solder electrode 14 of the semiconductor chip 13.

FIG. 2 is a process cross-sectional view showing a modification example of the electronic component of the invention. As shown in FIG. 2(a), a solder electrode 12 is formed on the interposer 11. In the electronic component 20, the solder electrode 12 on the interposer 11 and the solder electrode 14 of the semiconductor chip 13 are bonded by metallic bonding, thereby forming solder joints 15, and thus the interposer 11 and the semiconductor chip 13 are electrically connected.

An embodiment of an electronic component formed by bonding an interposer and a semiconductor chip is explained herein using FIG. 1 and FIG. 2, but there are no particular limitations on the bonding, and any materials selected from a rigid substrate, a flexible substrate, a semiconductor chip, a semiconductor wafer, and the like can be appropriately combined.

[Method for Manufacturing Electronic Component]

The method for manufacturing an electronic component of the invention will be explained using FIG. 3 to FIG. 8.

First Embodiment

Figure 3:
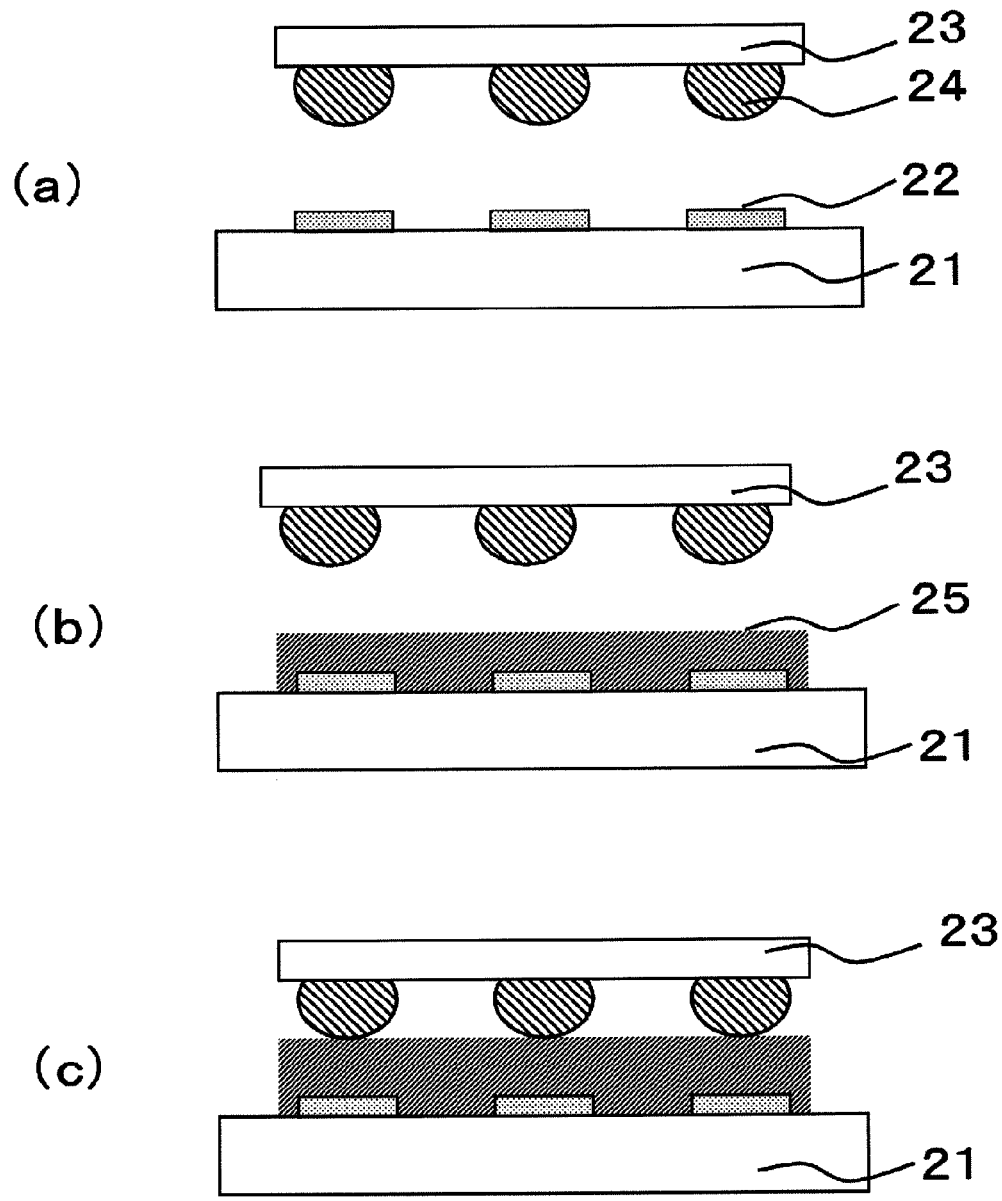
FIG. 3 is a process cross-sectional view showing a method for manufacturing an electronic component according to a first embodiment of the invention.
Figure 4:
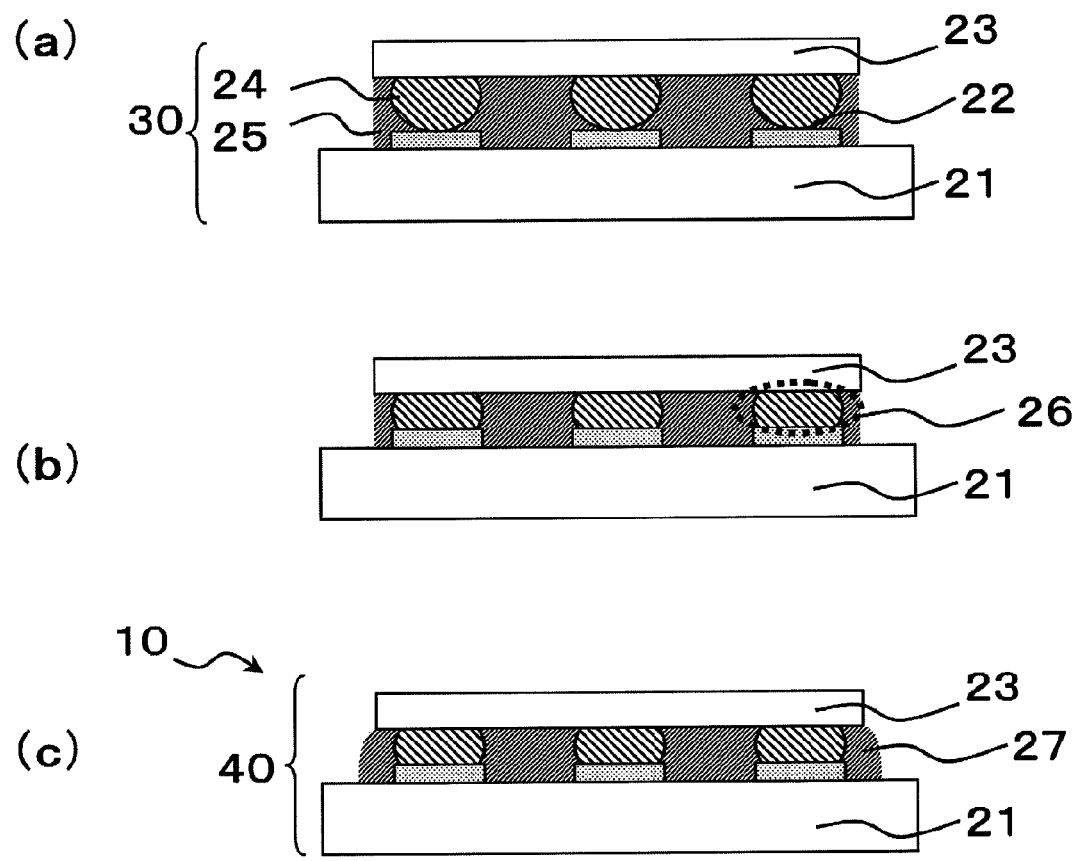
FIG. 4 is a process cross-sectional view showing the method for manufacturing an electronic component according to the first embodiment of the invention.

FIGS. 3 and 4 are process cross-sectional views showing the method for manufacturing an electronic component according to the first embodiment of the invention.

[1A-1] First, an interposer 21 on which a metal electrode 22 is formed, and a semiconductor chip 23 on which solder electrodes 24 are formed, are provided.

According to the present embodiment, as shown in FIG. 3(a), the interposer 21 has a metal electrode 22 formed thereon. Furthermore, as shown in FIG. 3(a), the semiconductor chip 23 has solder electrodes 24 formed thereon.

[1A-2] Next, as shown in FIG. 3(b), a resin layer 25 containing a thermosetting resin is formed on the metal electrode 22 side of the interposer 21 where the metal electrode 22 has been formed (first step).

As the method for forming the resin layer 25 containing a thermosetting resin, for example, the resin layer can be obtained by techniques such as lamination, coating, and printing. According to the present embodiment, the resin layer is formed on the metal electrode 22 side of the interposer 21, but the resin layer may also be formed on the solder electrode 24 side of the semiconductor chip 23 where the solder electrodes 24 have been formed. Furthermore, the resin layer 25 containing a thermosetting resin may also be formed on both of the metal electrode 22 side of the interposer 21 and the solder electrode 24 side of the semiconductor chip 23.

There are no particular limitations on the conditions under which the resin layer 25 containing a thermosetting resin is laminated on the metal electrode 22 side of the interposer 21 where the metal electrode 22 has been formed, but for example, the lamination can be carried out under the conditions of a temperature of 50° C. to 150° C. If the lamination temperature is equal to or lower than the above range, adhesiveness of the resin layer to the interposer 21 is insufficient, and when the interposer is conveyed, the resin layer 25 containing a thermosetting resin may be peeled off. Also, if the lamination temperature is equal to or higher than the above range, the resin layer 25 containing a thermosetting resin undergoes curing, and fluidity of the resin layer 25 containing a thermosetting resin decreases. Therefore, when the metal electrode 22 and the solder electrodes 24 are fusion bonded, the resin layer 25 containing a thermosetting resin may remain between the metal electrode 22 and the solder electrodes 24, and satisfactory solder joints may not be formed.

Furthermore, there are no particular limitations on the conditions under which the resin layer 25 containing a thermosetting resin is applied or printed on the metal electrode 22 side of the interposer 21 where the metal electrode 22 has been formed, but for example, spin coating and screen printing may be given. Among them, screen printing is preferable.

[1A-3] Next, as shown in FIG. 3(c), the metal electrode 22 of the interposer 21 and the solder electrodes 24 of the semiconductor chip 23 are positioned to face each other. Subsequently, as shown in FIG. 4(a), the metal electrode 22 and the solder electrodes 24 are brought into contact by heating the electrodes under pressure at a temperature lower than the melting point of the solder of the solder electrode 24, and thus a stack 30 of the interposer 21 and the semiconductor chip 23 is formed (second step).

There are no particular limitations on the method for positioning the electrodes, but the metal electrode 22 of the interposer 21 and the solder electrodes 24 of the semiconductor chip 23 can be positioned to face each other by a method of using an alignment mark, or the like.

The heating at the time of bringing the metal electrode 22 and the solder electrodes 24 into contact is carried out at a temperature that is lower than the melting point of the solder of the solder electrode 24. When the heating temperature is set to a temperature lower than the melting point of the solder of the solder electrode 24, the resin layer 25 containing a thermosetting resin intermediates between the metal electrode 22 and the solder electrodes 24, and the occurrence of any joint failure can be prevented. Furthermore, when the metal electrode 22 is fusion bonded to the solder electrodes 24 (which will be described later), fluidity of the resin layer 25 containing a thermosetting resin can be secured, and the surfaces of the metal electrode 22 and the solder electrodes 24 can be covered. Thus, the oxide film on the surfaces of the metal electrode 22 and the solder electrodes 24 can be more efficiently removed.

More specifically, the heating temperature is 190° C. or lower, preferably 180° C. or lower, and particularly preferably 170° C. or lower. As the heating temperature at the time of bringing the electrodes into contact is set to be equal to or lower than the above range, when the metal electrode 22 is fusion bonded to the solder electrodes 24 (which will be described later), fluidity of the resin layer 25 containing a thermosetting resin can be secured.

[1A-4] Next, as shown in FIG. 4(b), when the stack 30 of the interposer 21 and the semiconductor chip 23 obtained by bringing the metal electrode 22 and the solder electrodes 24 into contact, is heated at a temperature higher than the melting point of the solder of the solder electrode 24 while pressure is applied by a pressurized fluid, the metal electrode 22 and the solder electrodes 24 are fusion bonded, and thereby solder joints 26 are formed (third step).

When the heating temperature is set to a temperature higher than the melting point of the solder of the solder electrode 24, the solder of the solder electrode 24 sufficiently spreads to wet. Therefore, the metal electrode 22 and the solder electrodes 24 are securely fusion bonded, and solder joints 26 can be formed.

More specifically, the heating temperature is 200° C. or higher, preferably 205° C. or higher, and particularly preferably 210° C. or higher. When the heating temperature in the third step is set to be equal to or higher than the above range, the solder of the solder electrodes 24 sufficiently spreads to wet. Therefore, the metal electrode 22 and the solder electrodes 24 are securely fusion bonded, and solder joints 26 can be formed.

There are no particular limitations on the method of heating the stack 30 of the interposer 21 and the semiconductor chip 23 at a temperature higher than the melting point of the solder of the solder electrode 24 while pressure is applied by a pressurized fluid in the third step, but an example may be a method of placing the stack 30 of the interposer 21 and the semiconductor chip 23 in a pressure vessel, and then heating the stack 30 of the interposer 21 and the semiconductor chip 23 while applying pressure by introducing a pressurized fluid into the pressure vessel.

More specifically, there may be given a method of placing the stack 30 of the interposer 21 and the semiconductor chip 23 in a pressure-compliant oven, and heating the object of treatment in the pressure-compliant oven while introducing a gas for pressurization into the pressure-compliant oven. Furthermore, the gas for pressurization is not particularly limited, and may be nitrogen, air, or the like. However, nitrogen which can prevent oxidation of the metal electrode 22 and the solder electrodes 24 more efficiently is preferable.

There are no particular limitations on the conditions of pressurization by a pressurized fluid in the third step, and the pressurization can be carried out under the conditions of 0.2 to 1 MPa, preferably 0.3 to 0.9 MPa, and particularly preferably 0.4 to 0.8 MPa. When the conditions for pressurization by a pressurized fluid are set to the above range, the metal electrode 22 and the solder electrodes 24 can be securely fusion bonded, and thereby the generation of cavities (air gaps) and voids (air bubbles) within the resin layer containing a thermosetting resin can be suppressed. In this regard, it is believed that due to the difference between the atmospheric pressure and the pressure in the cavities (air gaps) and voids (air bubbles) in the resin layer 25 containing a thermosetting resin, the cavities (air gaps) and voids (air bubbles) are compressed, and the cavities (air gaps) and voids (air bubbles) diffuse into the resin layer containing a thermosetting resin, so that the generation of cavities (air gaps) and voids (air bubbles) can be suppressed.

Furthermore, in the third step, it is preferable to cool the stack to a temperature lower than the melting point of the solder of the solder electrode 24, and then to release the pressure exerted by the pressurized fluid. Thereby, the occurrence of joint failure due to a spread-out of the spacing between the interposer 21 and the semiconductor chip 23 can be prevented.

More specifically, the temperature at which the pressure is released is 200° C. or lower, preferably 190° C. or lower, and particularly preferably 180° C. or lower. Thereby, the occurrence of joint failure due to a spread-out of the spacing between the interposer 21 and the semiconductor chip 23 can be prevented.

[1A-5] Next, as shown in FIG. 4(c), the stack 30 of the interposer 21 and the semiconductor chip 23 in which the metal electrode 22 and the solder electrodes 24 are fusion bonded, is heated at a temperature lower than the melting point of the solder of the solder electrode 24, and thus the resin layer 25 containing a thermosetting resin is cured to form encapsulating areas 27. Thus, a bonded body 40 of the interposer 21 and the semiconductor chip 23 is obtained (fourth step).

In this case, when the heating temperature is set to a temperature lower than the melting point of the solder of the solder electrode 24, it can be prevented that the solder joints 26 remelts, thereby making the electrical connection unstable. For example, the heating temperature is preferably 210° C. or lower.

In addition, the heating of the stack 30 of the interposer 21 and the semiconductor chip 23 may be carried out such that, in addition to heating at a predetermined single temperature, for example, step curing in which the stack may be heated for 30 minutes at 150° C. and then heated for 30 minutes at 180° C., or post-curing in which the stack is hot pressed for 30 seconds at 150° C. and then cured in an oven for 60 minutes at 180° C., may be implemented.

Furthermore, when the resin layer 25 containing a thermosetting resin is cured, it is preferable to apply pressure using a pressurized fluid in the same manner as in the above step [1A-4]. In regard to the conditions for pressurization by a pressurized fluid, the pressurization can be carried out under the same conditions as the conditions for the above step [1A-4]. Then, due to the difference between the atmospheric pressure and the pressure in the cavities (air gaps) and voids (air bubbles) in the resin layer 25 containing a thermosetting resin, the cavities (air gaps) and voids (air bubbles) are compressed, and the cavities (air gaps) and voids (air bubbles) diffuse into the resin layer 25 containing a thermosetting resin. Thus, an effect of suppressing the generation of cavities (air gaps) and voids (air bubbles) can be further increased.

As discussed above, when fusion bonding is carried out at a temperature higher than the melting point of the solder of the solder electrode 24 while pressure is applied by a pressurized fluid, and then the resin layer 25 containing a thermosetting resin is cured at a temperature lower than the melting point of the solder of the solder electrode 24, the interposer 21 and the semiconductor chip 23 are electrically connected, and thus a bonded body 40 of the interposer 21 and the semiconductor chip 23 in which the interposer 21 and the semiconductor chip 23 are fixed, can be formed. Since this bonded body 40 of the interposer 21 and the semiconductor chip 23 is fusion bonded at a temperature higher than the melting point of the solder of the solder electrode 24 while pressure is applied by a pressurized fluid, a bonded body 40 of the interposer 21 and the semiconductor chip 23 in which cavities and voids are generated less, can be obtained.

Here, in the invention, the interposer 21 and the semiconductor chip 23 (first electronic component and second electronic component) are electrically connected through a solidified material such as the solder joints 26. Accordingly, even if the encapsulating areas 27 composed of the thermosetting resin undergo expansion due to the heat generated by the semiconductor chip 23 when the electronic component 10 is driven, breakage of this electrical connection can be suitably prevented, and stable conduction between the first electronic component and the second electronic component can be obtained. That is, an electrical connection can be obtained in which the connection reliability between the first electronic component and the second electronic component is excellent.

There are no particular limitations on the thickness of the solder joints 26, that is, the thickness (average) of the solder joints 26 in the bonded body 40 of the interposer 21 and the semiconductor chip 23, but the thickness is preferably about 3 to 300 μm, and more preferably about 5 to 150 μm. As such, when the spacing distance between the interposer 21 and the semiconductor chip 23 is made small, the overall thickness of the electronic component 10 can be made small as well, and further weight reduction of the electronic component 10 can be promoted.

Second Embodiment

Figure 5:
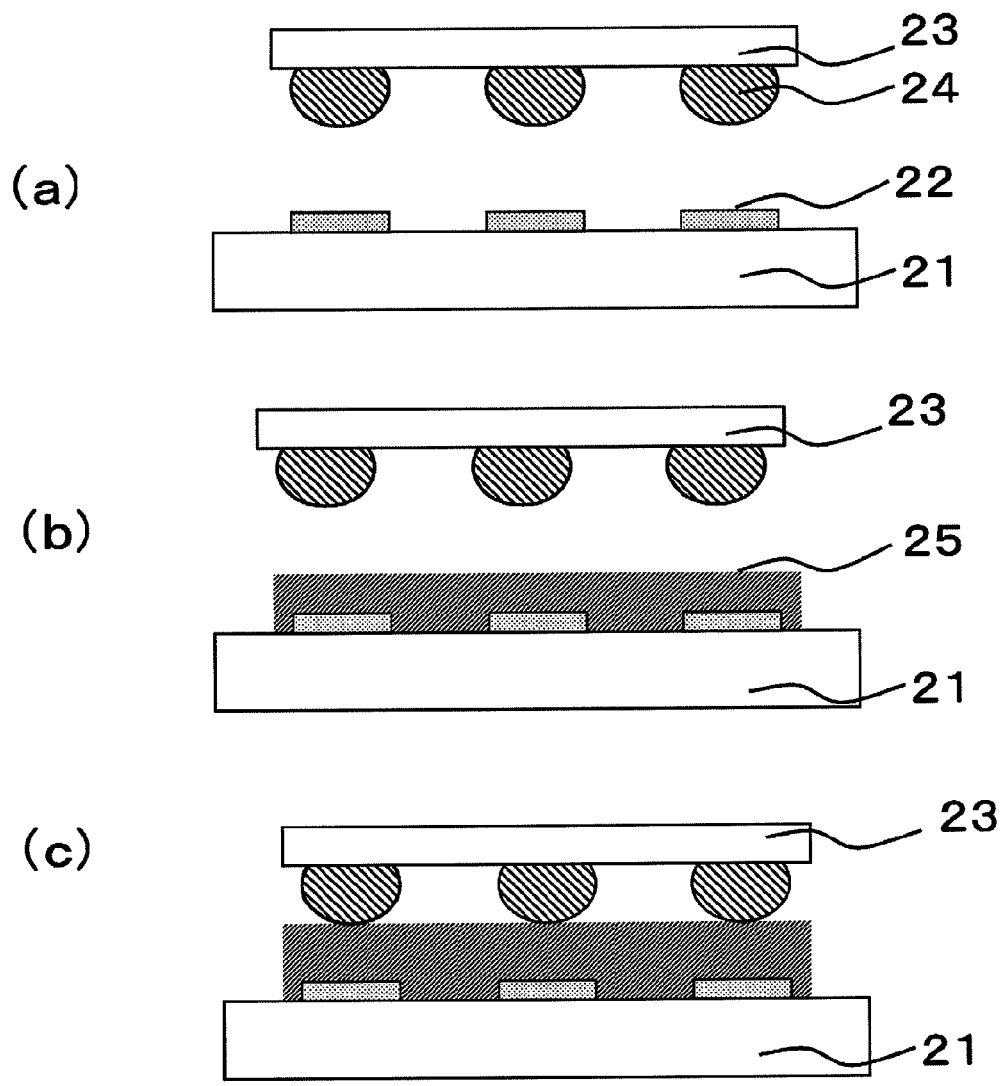
FIG. 5 is a process cross-sectional view showing a method for manufacturing an electronic component according to a second embodiment of the invention.
Figure 6:
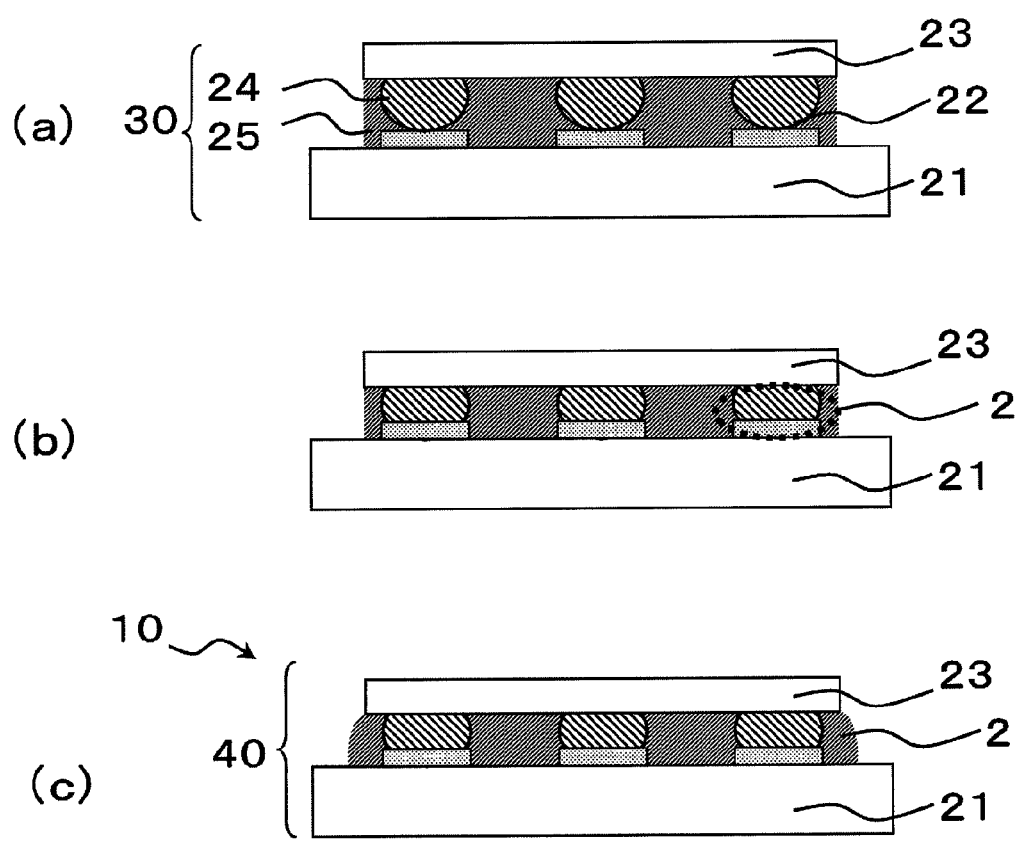
FIG. 6 is a process cross-sectional view showing the method for manufacturing an electronic component according to the second embodiment of the invention.

FIGS. 5 and 6 are process cross-sectional views showing the method for manufacturing an electronic component according to the second embodiment of the invention. According to the first embodiment, heating is carried out at a temperature lower than the melting point of the solder of the solder electrode 24 and applying pressure in the second step, heating is carried out at a temperature higher than the melting point of the solder of the solder electrode 24 in the third step, and heating is carried out at a temperature lower than the melting point of the solder of the solder electrode 24 in the fourth step. On the other hand, according to the second embodiment, heating is carried out at a temperature at which the coefficient of thermal expansion of the solder of the solder electrode 24 is $30 \times 10^{-6}$/° C. or less and applying pressure in the second step, heating is carried out at a temperature at which the coefficient of thermal expansion of the solder of the solder electrode 24 is greater than $30\times10^{-6}/°$ C. in the third step, and heating is carried out at a temperature at which the coefficient of thermal expansion of the solder of the solder electrode 24 is $30\times10^{-6}/°$ C. or less in the fourth step. Other parts of the constitution are the same as in the first embodiment, and therefore, a detailed description will not be repeated.

As shown in FIGS. 5(*a*) and 5(*b*), a resin layer 25 containing a thermosetting resin is formed on the metal electrode 22 side of the interposer 21 where the metal electrode 22 is formed (first step).

[2A-3] Next, as shown in FIG. 5(*c*), the metal electrode 22 of the interposer 21 and the solder electrodes 24 of the semiconductor chip 23 are positioned to face each other. Subsequently, as shown in FIG. 6(*a*), the metal electrode 22 and the solder electrodes 24 are brought into contact by heating the electrodes at a temperature at which the coefficient of thermal expansion of the solder of the solder electrode 24 is $30\times10^{-6}/°$ C. or less and applying pressure. Thus, a stack 30 of the interposer 21 and the semiconductor chip 23 is formed (second step).

Here, the coefficient of thermal expansion of the solder of the solder electrode 24 can be determined by the following method.

The coefficient of thermal expansion at a temperature equal to or higher than the melting point of the solder can be calculated by a software database for metallic material properties calculation, JMatPro (manufactured by Sente Software, Ltd.).

The coefficient of thermal expansion at a temperature equal to or lower than the melting point of the solder can be calculated by a thermomechanical analyzer (mode: compression, load: 50 N, rate of temperature increase: 5° C./min).

More specifically, the heating temperature is 190° C. or lower, preferably 180° C. or lower, and particularly preferably 170° C. or lower. When the heating temperature at the time of bringing the electrodes into contact is set to be equal to or lower than the above range, fluidity of the resin layer 25 containing a thermosetting resin can be secured when the metal electrode 22 is fusion bonded to the solder electrodes 24 (which will be described later).

[2A-4] Next, as shown in FIG. 6(*b*), the stack 30 of the interposer 21 and the semiconductor chip 23 in which the metal electrode 22 and the solder electrodes 24 are brought into contact, is heated at a temperature at which the coefficient of thermal expansion of the solder of the solder electrode 24 is greater than $30\times10^{-6}/°$ C. while pressure is applied by a pressurized fluid, and thereby the metal electrode 22 and the solder electrodes 24 are fusion bonded. Thus, solder joints 26 are formed (third step).

As the method of heating the stack 30 of the interposer 21 and the semiconductor chip 23 at a temperature at which the coefficient of thermal expansion of the solder of the solder electrode 24 is greater than $30\times10^{-6}/°$ C. while pressure is applied by a pressurized fluid in the third step, the same method as that used in the step [2A-4] can be used.

Furthermore, in the third step, it is preferable to cool the stack to a temperature at which the coefficient of thermal expansion of the solder of the solder electrode 34 is $30\times10^{-6}/°$ C. or less, and then to release the pressure. Thereby, the occurrence of joint failure due to a spread-out of the spacing between the interposer 31 and the semiconductor chip 33 can be prevented.

More specifically, the heating temperature is 200° C. or higher, preferably 205° C. or higher, and particularly preferably 210° C. or higher. When the heating temperature in the third step is set to be equal to or higher than the above range, the solder of the solder electrode 24 sufficiently spreads to wet. Therefore, the metal electrode 22 and the solder electrodes 24 are securely fusion bonded, and thus solder joints 26 can be formed.

[2A-5] Next, as shown in FIG. 6(*c*), the stack 30 of the interposer 21 and the semiconductor chip 23 in which the metal electrode 22 and the solder electrodes 24 are fusion bonded, is heated at a temperature at which the coefficient of thermal expansion of the solder of the solder electrode 24 is $30\times10^{-6}/°$ C. or lower, and thereby the resin layer 25 containing a thermosetting resin is cured to form encapsulating areas 27. Thus, a bonded body 40 of the interposer 21 and the semiconductor chip 23 is obtained (fourth step).

In this case, when heating is carried out at a temperature at which the coefficient of thermal expansion of the solder of the solder electrode 24 is $30\times10^{-6}/°$ C. or less, and thus the resin layer 25 containing a thermosetting resin is cured, it can be prevented that the solder joints 26 remelts, thereby making the electrical connection unstable. For example, the heating temperature is preferably 210° C. or lower.

Also for the second embodiment, the same effects as those of the first embodiment can be obtained.

Third Embodiment

Figure 7:
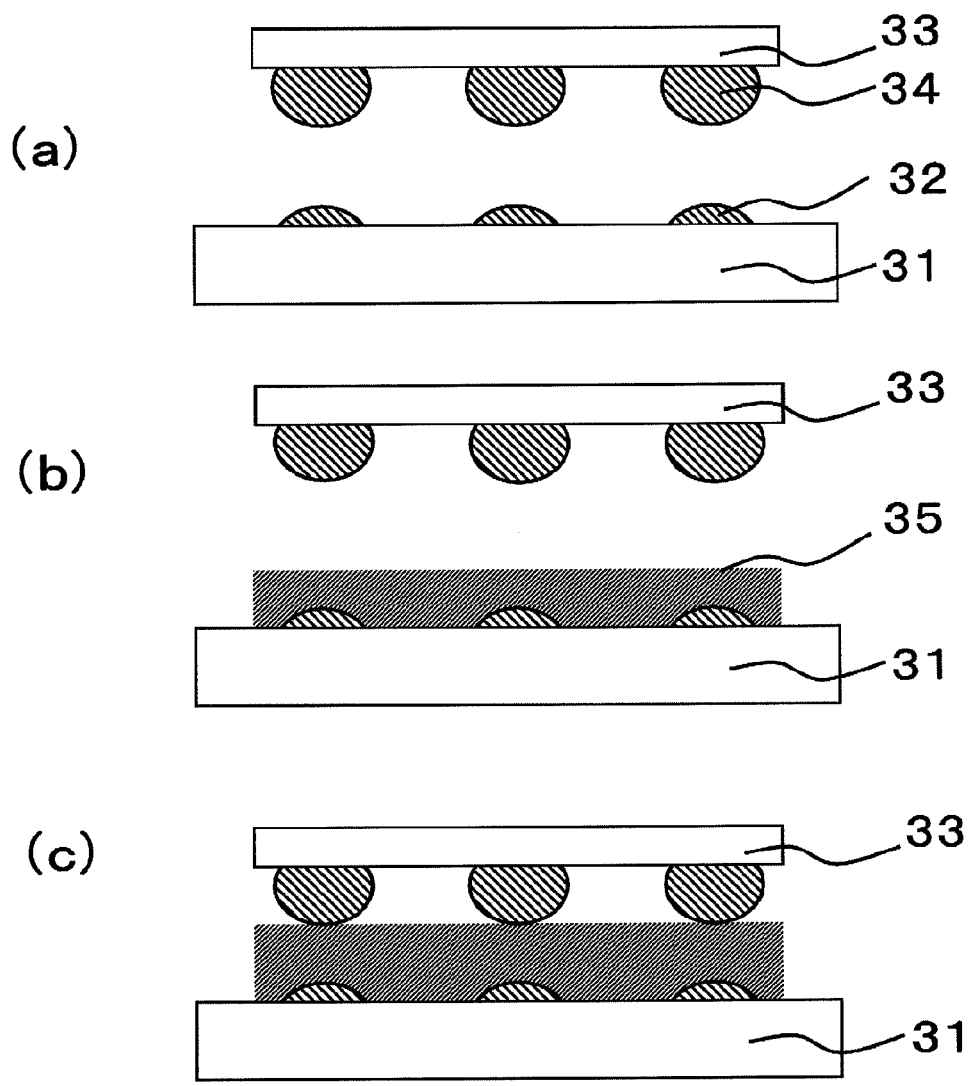
FIG. 7 is a process cross-sectional view showing a method for manufacturing an electronic component according to a third embodiment of the invention.
Figure 8:
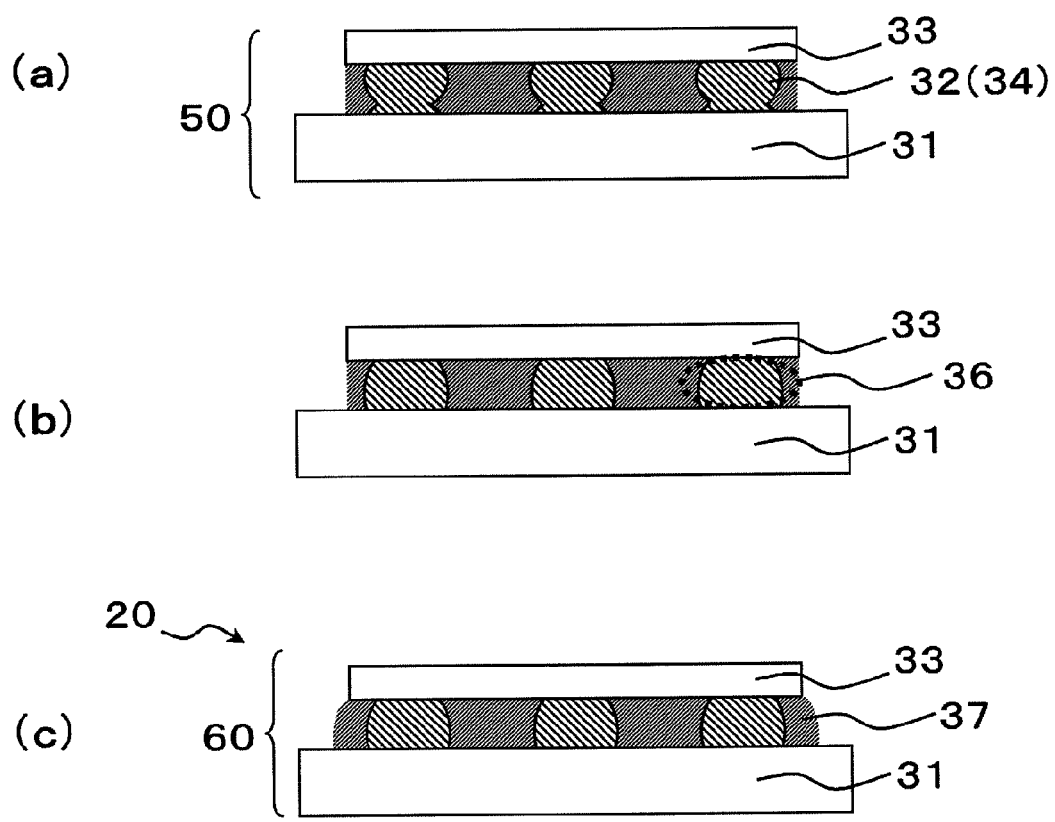
FIG. 8 is a process cross-sectional view showing the method for manufacturing an electronic component according to the third embodiment of the invention.

FIGS. 7 and 8 are process cross-sectional views showing the method for manufacturing an electronic component according to the third embodiment of the invention. In the first and second embodiments, examples of using a metal electrode 22 were explained. The third embodiment is an example of using solder electrodes 32. Other parts of the constitution are the same as in the second embodiment, and therefore, a detailed description will not be repeated.

[3A-1] First, an interposer 31 on which solder electrodes 32 are formed, and a semiconductor chip 33 on which solder electrodes 34 are formed, are provided. Here, the solder electrodes 32 and the solder electrodes 34 may be formed of the same material, or may be formed of different materials.

According to the present embodiment, as shown in FIG. 7(*a*), the interposer 31 has solder electrodes 32 formed thereon, and the semiconductor chip 33 has solder electrodes 34 formed thereon.

[3A-2] Next, as shown in FIG. 7(*b*), a resin layer 35 containing a thermosetting resin is formed on the metal electrode 32 side of the interposer 31 on which the solder electrodes 32 are formed (first step).

[3A-3] Next, as shown in FIG. 7(*c*), the solder electrodes 32 of the interposer 31 and the solder electrodes 34 of the semiconductor chip 33 are positioned to face each other. Subsequently, as shown in FIG. 8(*a*), heating is carried out at a temperature at which the coefficient of thermal expansion of the solder of the solder electrode 32 and the solder electrode 34 is $30\times10^{-6}/°$ C. or less, and the degree of curing of the resin layer 35 containing a thermosetting resin is 80% or less and applying pressure, and thereby the solder electrodes 32 and the solder electrodes 34 are brought into contact. Thus, a stack 50 of the interposer 31 and the semiconductor chip 33 is formed (second step).

[3A-4] Next, as shown in FIG. 8(b), when the stack 50 of the interposer 31 and the semiconductor chip 33 in which the solder electrodes 32 and the solder electrodes 34 are brought into contact, is heated at a temperature at which the coefficient of thermal expansion of the solder of at least one of the solder electrode 32 and the solder electrode 34 is greater than $30 \times 10^{-6}$/° C. while pressure is applied by a pressurized fluid, the solder electrodes 32 and the solder electrodes 34 are fusion bonded, and thereby solder joints 36 are formed (third step).

As the method of heating the stack 50 of the interposer 31 and the semiconductor chip 33 at a temperature at which the coefficient of thermal expansion of the solder of the solder electrode 32 or the solder electrode 34 is greater than $30 \times 10^{-6}$/° C. while pressure is applied by a pressurized fluid in the third step, the same method as that used in the step [3A-4] can be used.

Furthermore, in the third step, it is preferable to cool the stack to a temperature lower than the melting point of the solder of the solder electrode 32 and the solder electrode 34, and then to release the pressure exerted by a pressurized fluid. Thereby, the occurrence of joint failure due to spreading-out of the spacing between the interposer 31 and the semiconductor chip 33 can be prevented.

More specifically, in the third step, it is preferable to cool the stack to a temperature at which the coefficient of thermal expansion of the solder of the solder electrode 34 is $30 \times 10^{-6}$/° C. or less, and then to release the pressure exerted. Thereby, the occurrence of joint failure due to a spread-out of the spacing between the interposer 31 and the semiconductor chip 33 can be prevented.

More specifically, the temperature at which the pressure is released is 200° C. or lower, preferably 190° C. or lower, and particularly preferably 180° C. or lower. Thus, the occurrence of joint failure due to a spread-out of the spacing between the interposer 31 and the semiconductor chip 33 can be prevented.

[3A-5] Next, as shown in FIG. 8(c), the stack 50 of the interposer 31 and the semiconductor chip 33 in which the solder electrodes 32 and the solder electrodes 34 are fusion bonded, is heated at a temperature at which the coefficient of thermal expansion of the solder of the solder electrode 32 and the solder electrode 34 is $30 \times 10^{-6}$/° C. or less, and thereby the resin layer 35 containing a thermosetting resin is cured to form encapsulating areas 37. Thus, a bonded body 60 of the interposer 31 and the semiconductor chip 33 is obtained (fourth step).

In this case, when heating is carried out at a temperature at which the coefficient of thermal expansion of the solder of the solder electrode 32 and the solder electrode 34 is $30 \times 10^{-6}$/° C. or less, and thereby the resin layer 35 containing a thermosetting resin is cured, it can be prevented that the solder joints 36 remelts, thereby making the electrical connection unstable.

Furthermore, when the resin layer 35 containing a thermosetting resin is cured, it is preferable to apply pressure by a pressurized fluid in the same manner as in the step [3A-4]. For the conditions for pressurization by a pressurized fluid, the same method as that used in the step [3A-4] can be used. Then, due to the difference between the atmospheric pressure and the pressure in the cavities (air gaps) and voids (air bubbles) in the resin layer 35 containing a thermosetting resin, the cavities (air gaps) and voids (air bubbles) are compressed, and the cavities (air gaps) and voids (air bubbles) diffuse into the resin layer containing a thermosetting resin. Thus, an effect of suppressing the generation of cavities (air gaps) and voids (air bubbles) can be further increased.

Here, according to the invention, the interposer 31 and the semiconductor chip 33 (first electronic component and second electronic component) are electrically connected through a solidified material such as the solder joints 36. Accordingly, even if the encapsulating areas 37 composed of the thermosetting resin undergo expansion due to the heat generated by the semiconductor chip 33 when the electronic component 20 is driven, breakage of this electrical connection can be suitably prevented, and stable conduction between the first electronic component and the second electronic component can be obtained. That is, an electrical connection can be obtained in which the connection reliability between the first electronic component and the second electronic component is excellent.

There are no particular limitations on the thickness of the solder joints 36, that is, the thickness (average) of the solder joints 36 in the bonded body 60 of the interposer 31 and the semiconductor chip 33, but the thickness is preferably about 3 to 300 μm, and more preferably about 5 to 150 μm. As such, when the spacing distance between the interposer 31 and the semiconductor chip 33 is made small, the overall thickness of the electronic component 20 can be made small as well, and further weight reduction of the electronic component 20 can be promoted.

Furthermore, when fusion bonding is carried out at a temperature higher than the melting point of the solder of at least one of the solder electrode 32 or the solder electrode 34 while pressure is applied by a pressurized fluid, and then the resin layer 35 containing a thermosetting resin is cured at a temperature lower than the melting point of the solder of the solder electrode 32 and the solder electrode 34, the interposer 31 and the semiconductor chip 33 are electrically connected, and thus a bonded body 60 of the interposer 31 and the semiconductor chip 33 in which the interposer 31 and the semiconductor chip 33 are fixed, can be formed. Since this bonded body 60 of the interposer 31 and the semiconductor chip 33 is fusion bonded at a temperature higher than the melting point of the solder of the solder electrode 34 while pressure is applied by a pressurized fluid, a bonded body 60 of the interposer 31 and the semiconductor chip 33 in which cavities and voids are generated less, can be obtained.

Also in the Third embodiment, the same effects as those of the second embodiment can be obtained.

As such, the method for manufacturing an electronic component and the electronic component of the invention have been described, but the invention is not intended to be limited to these. For example, the method for manufacturing an electronic component of the invention can be suitably used in the connection of an electronic component and a member where solder joining is required, such as the connection of a semiconductor device and a substrate, a substrate and a substrate, a semiconductor device and a semiconductor device, a semiconductor device and a semiconductor wafer, and a semiconductor wafer and a semiconductor wafer.

EXAMPLES

Example 1

1. Preparation of Resin Varnish for Resin Layer Containing Thermosetting Resin 15.0 parts by weight of a phenol novolac resin (manufactured by Sumitomo Bakelite Co., Ltd., PR55617), 45.0 parts by weight of a liquid bisphenol A type epoxy resin (manufactured by Dainippon Ink & Chemicals, Inc., EPICLON-840S), 15.0 parts by weight of phenolphthalin (manufactured by Tokyo Chemical Industry Co., Ltd.), which is a flux activating compound, 24.4 parts by weight of a bisphenol A type phenoxy resin (manufactured by Tohto Kasei Co., Ltd., YP-50) as a film-forming resin, 0.1 parts by weight of 2-phenyl-4-methylimidazole (manufactured by Shikoku Chemical Corp., 2P4MZ) as a curing accelerator, and 0.5 parts by weight of β-(3,4-epoxycyclohexyl)ethyltrimethoxysilane (manufactured by Shin-Etsu Chemical Co., Ltd., KBM-303) as a silane coupling agent were dissolved in methyl ethyl ketone, and thereby a resin varnish at a resin concentration of 50% was prepared.

2. Preparation of Resin Layer (Film) Containing Thermosetting Resin

The resin varnish thus obtained was applied on a base material polyester film (manufactured by Toray Industries, Inc., LUMIRROR) to a thickness of 50 μm, and was dried for 5 minutes at 100° C. Thus, a resin layer (film) containing a thermosetting resin and having a thickness of 25 μm was obtained.

3. Preparation of Electronic Component
<First Step>

The resin layer (film) containing a thermosetting resin thus obtained was laminated on a semiconductor device (size 10 mm×10 mm, thickness 0.3 mm) having solder bumps (Sn 96.5/Ag 3.5, melting point 221° C.) using a vacuum roll laminator under the conditions of 100° C. and 0.8 MPa for 30 seconds. Thus, a semiconductor device with an attached resin layer containing a thermosetting resin was obtained.

<Second Step>

Next, a circuit board having an Ni/Au pad was provided, and the circuit board was positioned such that the solder bumps of the semiconductor device with an attached resin layer containing a thermosetting resin overlapped with the Ni/Au pad, and the solder bumps and the Ni/Au pad were brought into contact by using a flip-chip bonder (manufactured by Shibuya Kogyo Co., Ltd., DP-200) under the conditions of 120° C. and 0.05 MPa for 7 seconds. Thus, a stack of a circuit board/semiconductor device was obtained.

<Third Step>

The stack of the circuit board/semiconductor device thus obtained was heated at 230° C. for 10 minutes in a commercially available pressure-compliant oven, while an additional pressure of 0.5 MPa was applied inside the oven by a nitrogen atmosphere. Thus, the solder bumps and the Ni/Au pad were fusion bonded.

<Fourth Step>

The stack of the circuit board/semiconductor device in which the solder bumps and the Ni/Au pad were bonded, was placed in a commercially available heating oven, and was subjected to a thermal history at 180° C. for 60 minutes to cure the resin layer containing a thermosetting resin. Thus, an electronic component was produced.

Example 2

An electronic component was produced in the same manner as in Example 1, except that the temperature at which the solder bumps and the pad were brought into contact in the second step of Example 1 was changed from 120° C. to 150° C.

Example 3

An electronic component was produced in the same manner as in Example 1, except that the temperature at which the solder bumps and the pad were brought into contact in the second step of Example 1 was changed from 120° C. to 180° C.

Example 4

An electronic component was produced in the same manner as in Example 1, except that the pressure employed for bonding the stack in the third step of Example 1 was changed from 0.5 MPa to 0.3 MPa.

Example 5

An electronic component was produced in the same manner as in Example 1, except that the pressure employed for bonding the stack in the third step of Example 1 was changed from 0.5 MPa to 0.8 MPa.

Example 6

An electronic component was produced in the same manner as in Example 1, except that the atmosphere employed for bonding the stack in the third step of Example 1 was changed from nitrogen to air.

Example 7

An electronic component was produced in the same manner as in Example 1, except that instead of curing the resin layer containing a thermosetting resin in a commercially available heating oven at 180° C. for 60 minutes in the fourth step of Example 1, curing was performed in a commercially available pressure-compliant oven in a nitrogen atmosphere at 180° C. and 0.5 MPa for 60 minutes.

Example 8

An electronic component was produced in the same manner as in Example 1, except that solder bumps (Sn 96.5/Ag 3.5, melting point 221° C.) were used instead of the circuit board having a Ni/Au pad in the second step of Example 1, and instead of curing the resin layer containing a thermosetting resin in a commercially available heating oven at 180° C. for 60 minutes in the fourth step, curing was performed in a commercially available pressure-compliant oven in a nitrogen atmosphere at 180° C. and 0.5 MPa for 60 minutes.

Reference Example 1

An electronic component was produced in the same manner as in Example 1, except that solder bumps (Sn 63/Pb 37, melting point 183° C.) were used instead of the solder bumps (Sn 96.5/Ag 3.5, melting point 221° C.) in the first step of Example 1; the temperature employed for bonding the stack in the third step was changed from 230° C. to 195° C.; and instead of curing the resin layer containing a thermosetting resin in a commercially available heating oven at 180° C. for 60 minutes in the fourth step, curing was performed in a commercially available pressure-compliant oven in a nitrogen atmosphere at 165° C. and 0.5 MPa for 120 minutes.

Reference Example 2

An electronic component was produced in the same manner as in Example 1, except that solder bumps (Sn 89/Zn 8/Bi 3, melting point 195° C.) were used instead of the solder bumps (Sn 96.5/Ag 3.5, melting point 221° C.) in the first step of Example 1; the temperature employed for bonding the stack in the third step was changed from 230° C. to 210° C.; and instead of curing the resin layer containing a thermosetting resin in a commercially available heating oven at 180° C. for 60 minutes in the fourth step, curing was performed in a commercially available pressure-compliant oven in a nitrogen atmosphere at 180° C. and 0.5 MPa for 60 minutes.

Comparative Example 1

An electronic component was produced in the same manner as in Example 1, except that the additional pressure employed in the third step of Example 1 was changed from 0.5 MPa to atmospheric pressure.

Comparative Example 2

An electronic component was produced in the same manner as in Example 1, except that the bonding temperature employed in the second step of Example 1 was changed from 120° C. to 240° C.

Comparative Example 3

An electronic component was produced in the same manner as in Example 1, except that the curing temperature employed in the fourth step of Example 1 was changed from 180° C. to 240° C.

4. Calculation of Coefficient of Thermal Expansion of Solder

The coefficient of thermal expansion at a temperature equal to or higher than the melting point of the solder was calculated by a software database for metallic material properties calculation, JMatPro (manufactured by Sente Software, Ltd.)

The coefficient of thermal expansion at a temperature equal to or lower than the melting point of the solder was calculated by a thermomechanical analyzer (mode: compression, load: 50 N, rate of temperature increase: 5° C./min).

5. Evaluation of Electronic Component

<Cavities and Voids>

An electronic component thus obtained was cut, and the cross-section of the cured product was polished. Subsequently, 10 sites of an area surrounded by the semiconductor device, the circuit board, and two adjacent solder joints were arbitrarily selected, and the presence or absence of microvoids in each of the areas was observed with a microscope. The symbols are as follows.

○: When no microvoids were observed in any of the 10 sites x: When microvoids were observed even in one site <Conduction Reliability>

The connection resistance at two adjacent solder joints arbitrarily selected in an electronic component thus obtained was measured with a digital multimeter. Subsequently, 9 other sites of adjacent two solder joints were arbitrarily selected, and the connection resistance was measured in the same manner. Thus, measurement of conductive connection was carried out in 10 sites in total.

The respective symbols are as follows.

○: When conduction was obtained in all of the 10 sites x: When there was conduction failure even in one site <Insulating Property Between Electrodes>

The insulation resistance at two adjacent solder joints arbitrarily selected in an electronic component thus obtained was measured with a digital multimeter. Subsequently, 9 other sites of adjacent two solder joints were arbitrarily selected, and the insulation resistance was measured in the same manner. Thus, measurement of conductive connection was carried out in 10 sites in total.

○: When insulating property was maintained in all of 10 sites x: When short circuit occurred even in one site

TABLE 1

| | | | Ex. 1 | Ex. 2 | Ex. 3 | Ex. 4 | Ex. 5 | Ex. 6 | Ex. 7 | Ex. 8 | Ref. Ex. 1 | Ref. Ex. 2 | Comp. Ex. 1 | Comp. Ex. 2 | Comp. Ex. 3 |
|---|---|---|---|---|---|---|---|---|---|---|---|---|---|---|---|
| First step | Conditions for lamination | Temperature (°C.) | 100 | 100 | 100 | 100 | 100 | 100 | 100 | 100 | 100 | 100 | 100 | 100 | 100 |
| | | Pressure (MPa) | 0.8 | 0.8 | 0.8 | 0.8 | 0.8 | 0.8 | 0.8 | 0.8 | 0.8 | 0.8 | 0.8 | 0.8 | 0.8 |
| | | Time (seconds) | 30 | 30 | 30 | 30 | 30 | 30 | 30 | 30 | 30 | 30 | 30 | 30 | 30 |
| Second step | Conditions for bonding | Temperature (°C.) | 120 | 150 | 180 | 120 | 120 | 120 | 120 | 120 | 120 | 120 | 120 | 240 | 120 |
| | | Pressure (MPa) | 0.05 | 0.05 | 0.05 | 0.05 | 0.05 | 0.05 | 0.05 | 0.05 | 0.05 | 0.05 | 0.05 | 0.05 | 0.05 |
| | | Time (seconds) | 7 | 7 | 7 | 7 | 7 | 7 | 7 | 7 | 7 | 7 | 7 | 7 | 7 |
| Third step | Pressure curing | Fluid | $N_2$ | $N_2$ | $N_2$ | $N_2$ | $N_2$ | Air | $N_2$ | $N_2$ | $N_2$ | $N_2$ | $N_2$ Atmospheric pressure | $N_2$ | $N_2$ |
| | | Pressure (MPa) | 0.5 | 0.5 | 0.5 | 0.3 | 0.8 | 0.5 | 0.5 | 0.5 | 0.5 | 0.5 | | 0.5 | 0.5 |
| | | Temperature (°C.) | 230 | 230 | 230 | 230 | 230 | 230 | 230 | 230 | 195 | 210 | 230 | 230 | 230 |
| | | Time (minutes) | 10 | 10 | 10 | 10 | 10 | 10 | 10 | 10 | 10 | 10 | 10 | 10 | 10 |
| Fourth step | Curing | Temperature (°C.) | 180 | 180 | 180 | 180 | 180 | 180 | | 180 | | | 180 | 180 | 240 |
| | | Time (minutes) | 60 | 60 | 60 | 60 | 60 | 60 | | 60 | | | 60 | 60 | 60 |
| | Pressure curing | Fluid | | | | | | | $N_2$ | $N_2$ | $N_2$ | $N_2$ | | | |
| | | Pressure (MPa) | | | | | | | 0.5 | 0.5 | 0.5 | 0.5 | | | |
| | | Temperature (°C.) | | | | | | | 180 | 180 | 165 | 180 | | | |
| | | Time (minutes) | | | | | | | 60 | 60 | 120 | 60 | | | |
| Electrode material of first electronic component | | | Sn/Ag | Sn/Ag | Sn/Ag | Sn/Ag | Sn/Ag | Sn/Ag | Sn/Ag | Sn/Ag | Sn/Pb | Sn/Zn/Bi | Sn/Ag | Sn/Ag | Sn/Ag |
| Electrode material of second electronic component | | | Au/Ni | Au/Ni | Au/Ni | Au/Ni | Au/Ni | Au/Ni | Au/Ni | Sn/Ag | Au/Ni | Au/Ni | Au/Ni | Au/Ni | Au/Ni |
| Solder melting point of solder electrode (°C.) | | | 221 | 221 | 221 | 221 | 221 | 221 | 221 | 221 | 183 | 195 | 221 | 221 | 221 |
| Coefficient of thermal expansion of solder in third step (1/°C.) | | | $32 \times 10^{-6}$ | $32 \times 10^{-6}$ | $32 \times 10^{-6}$ | $32 \times 10^{-6}$ | $32 \times 10^{-6}$ | $32 \times 10^{-6}$ | $32 \times 10^{-6}$ | $32 \times 10^{-6}$ | $33 \times 10^{-6}$ | $31 \times 10^{-6}$ | $32 \times 10^{-6}$ | $32 \times 10^{-6}$ | $32 \times 10^{-6}$ |
| Coefficient of thermal expansion of solder in fourth step (1/°C.) | | | $24 \times 10^{-6}$ | $24 \times 10^{-6}$ | $24 \times 10^{-6}$ | $24 \times 10^{-6}$ | $24 \times 10^{-6}$ | $24 \times 10^{-6}$ | $24 \times 10^{-6}$ | $24 \times 10^{-6}$ | $26 \times 10^{-6}$ | $23 \times 10^{-6}$ | $24 \times 10^{-6}$ | $24 \times 10^{-6}$ | $24 \times 10^{-6}$ |
| Evaluation results for electronic component | Cavities and voids | | ○ | ○ | ○ | ○ | ○ | ○ | ○ | ○ | ○ | ○ | × | ○ | ○ |
| | Conduction reliability | | ○ | ○ | ○ | ○ | ○ | ○ | ○ | ○ | ○ | ○ | × | ○ | × |
| | Insulating property between electrodes | | ○ | ○ | ○ | ○ | ○ | ○ | ○ | ○ | ○ | ○ | × | × | ○ |

As is obvious from Table 1, no cavities and voids were observed in the encapsulating areas of the electronic components obtained in Examples 1 to 8 and Reference Examples 1 and 2. Furthermore, the electronic components of Examples 1 to 8 and Reference Examples 1 and 2 were also excellent in conduction reliability. Thus, it was suggested that the solder bumps and the Ni/Au pad were securely fusion bonded.

This application claims priority based on Japanese Patent Application No. 2009-168817 filed on Jul. 17, 2009, the entirety of the disclosure of which is incorporated herein by reference.

The invention claimed is:

1. A method for manufacturing an electronic component by using a solder joining method for bonding a first electronic component having a metal electrode for connection purposes with a second electronic component having a solder electrode for connection purposes, the method comprising the steps (i) to (iv) in this order:
   (i) forming a resin layer containing a thermosetting resin on at least one of the solder joint surfaces of said first electronic component and said second electronic component;
   (ii) positioning, after the formation of said resin layer containing a thermosetting resin, said metal electrode for connection purposes of said first electronic component with said solder electrode for connection purposes of said second electronic component to face each other, heating said positioned electrodes at a temperature lower than the melting point of said solder of said solder electrode for connection purposes and applying pressure, and thereby bringing said metal electrode for connection purposes and said solder electrode for connection purposes into contact;
   (iii) heating said first electronic component and said second electronic component that have been brought into contact at a temperature higher than the melting point of said solder of said solder electrode for connection purposes while applying pressure using a pressurized fluid, and thereby fusion bonding said solder of said solder electrode for connection purposes to said metal electrode for connection purposes; and
   (iv) heating said resin layer containing a thermosetting resin at a temperature lower than the melting point of said solder of said solder electrode for connection purposes, and thereby curing said resin layer.

2. The method for manufacturing an electronic component according to claim 1, wherein the heating temperature in the step (ii) is 190° C. or lower, the heating temperature in the step (iii) is 210° C. or higher, and the heating temperature in the step (iv) is 210° C. or lower.

3. The method for manufacturing an electronic component according to claim 1, wherein said metal electrode for connection purposes of the said first electronic component is a solder electrode for connection purposes.

4. The method for manufacturing an electronic component according to claim 1, further comprising cooling said first electronic component and said second electronic component that have been brought into contact into a temperature lower than the melting point of said solder of said solder electrode for connection purposes, and then the pressure applied using said pressurized fluid is released, after the step (iii) and prior to the step (iv).

5. The method for manufacturing an electronic component according to claim 4, wherein the temperature lower than the melting temperature of said solder of said solder electrode for connection purposes is 200° C. or lower.

6. The method for manufacturing an electronic component according to claim 1, wherein the step (iv) is conducted while pressure is applied by a pressurized fluid.

7. The method for manufacturing an electronic component according to claim 1, wherein said thermosetting resin includes an epoxy resin.

8. The method for manufacturing an electronic component according to claim 1, wherein said resin layer containing a thermosetting resin includes a flux activating compound.

9. An electronic component manufactured by using the method for manufacturing an electronic component according to claim 1.

10. A method for manufacturing an electronic component by using a solder joining method for bonding a first electronic component having a metal electrode for connection purposes and a second electronic component having a solder electrode for connection purposes, the method comprising the steps (i) to (iv) in this order:
   (i) forming a resin layer containing a thermosetting resin on at least one of the solder joint surfaces of said first electronic component and said second electronic component;
   (ii) positioning, after the formation of said resin layer containing a thermosetting resin, said metal electrode for connection purposes of said first electronic component with said solder electrode for connection purposes of said second electronic component to face each other, heating the positioned electrodes at a temperature at which the coefficient of thermal expansion of said solder of said solder electrode for connection purposes is $30 \times 10^{-6}/°$ C. or less and applying pressure, and thereby bringing said metal electrode for connection purposes and said solder electrode for connection purposes into contact;
   (iii) heating said first electronic component and said second electronic component that have been brought into contact, at a temperature at which the coefficient of thermal expansion of said solder of said solder electrode for connection purposes becomes greater than $30 \times 10^{-6}/°$ C., while applying pressure using a pressurized fluid, and thereby fusion bonding said solder of said solder electrode for connection purposes to said metal electrode for connection purposes; and
   (iv) heating said resin layer containing a thermosetting resin at a temperature at which the coefficient of thermal expansion of said solder of said solder electrode for connection purposes is $30 \times 10^{-6}/°$ C. or less, and thereby curing said resin layer.

11. The method for manufacturing an electronic component according to claim 10, wherein the heating temperature in the step (ii) is 190° C. or lower, the heating temperature in the step (iii) is 210° C. or higher, and the heating temperature in the step (iv) is 210° C. or lower.

12. The method for manufacturing an electronic component according to claim 10, wherein said metal electrode for connection purposes of the said first electronic component is a solder electrode for connection purposes.

13. The method for manufacturing an electronic component according to claim 10, further comprising cooling said first electronic component and said second electronic component that have been brought into contact into a temperature lower than the melting point of said solder of said solder electrode for connection purposes, and then the pressure applied using said pressurized fluid is released, after the step (iii) and prior to the step (iv).

14. The method for manufacturing an electronic component according to claim 13, wherein the temperature lower than the melting temperature of said solder of said solder electrode for connection purposes is 200° C. or lower.

15. The method for manufacturing an electronic component according to claim 10, wherein the step (iv) is conducted while pressure is applied by a pressurized fluid.

16. The method for manufacturing an electronic component according to claim 10, wherein said thermosetting resin includes an epoxy resin.

17. The method for manufacturing an electronic component according to claim 10, wherein said resin layer containing a thermosetting resin includes a flux activating compound.

18. An electronic component manufactured by using the method for manufacturing an electronic component according to claim 10.

* * * * *